United States Patent
Saito

(10) Patent No.: US 7,046,559 B2
(45) Date of Patent: May 16, 2006

(54) SEMICONDUCTOR MEMORY DEVICE CAPABLE OF ERASING OR WRITING DATA IN ONE BANK WHILE READING DATA FROM ANOTHER BANK

(75) Inventor: Hidetoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 321 days.

(21) Appl. No.: 10/375,116

(22) Filed: Feb. 28, 2003

(65) Prior Publication Data

US 2003/0218217 A1 Nov. 27, 2003

(30) Foreign Application Priority Data

Mar. 1, 2002 (JP) ........................ 2002-056365

(51) Int. Cl.
*G11C 16/04* (2006.01)

(52) U.S. Cl. ........................ 365/185.33; 365/185.03; 365/185.29

(58) Field of Classification Search ............ 365/185.33, 365/185.03, 185.29
See application file for complete search history.

(56) References Cited

U.S. PATENT DOCUMENTS

| | | | |
|---|---|---|---|
| 5,748,528 A | 5/1998 | Campardo et al. | |
| 5,894,437 A | 4/1999 | Chang et al. | |
| 6,151,657 A * | 11/2000 | Sun et al. | 711/103 |
| 6,377,502 B1 | 4/2002 | Honda et al. | |
| 6,388,919 B1 * | 5/2002 | Terasaki | 365/185.09 |
| 6,512,693 B1 | 1/2003 | Honda et al. | |
| 6,604,168 B1 * | 8/2003 | Ogawa | 711/103 |

FOREIGN PATENT DOCUMENTS

JP                325795 A       11/2001

* cited by examiner

*Primary Examiner*—Hoai Ho
(74) *Attorney, Agent, or Firm*—Oblon, Spivak, McClelland, Maier & Neustadt, P.C.

(57) ABSTRACT

There is disclosed a semiconductor memory device including a memory cell array containing a plurality of banks each having one or more blocks, a data erase circuit configured to erase data from selected blocks in banks at a unit of block, and an automatic multi-block erase circuit configured to enable a data read circuit configured to read data from memory cells provided in one bank, when data erase operation for all erase-object blocks in the one bank is completed, while continuing a data erasing operation of a next erase-object block included in another bank.

11 Claims, 15 Drawing Sheets

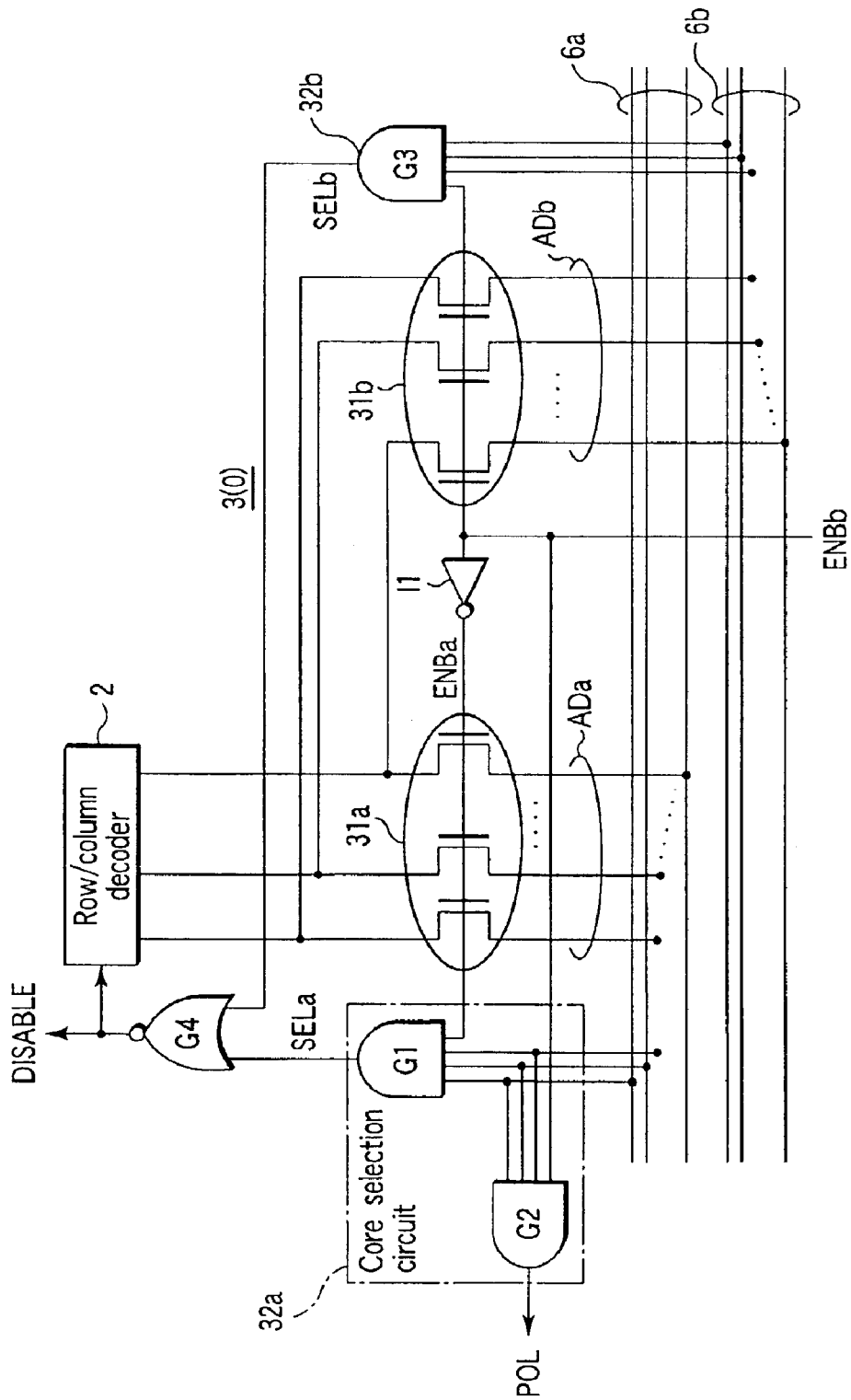
F I G. 3

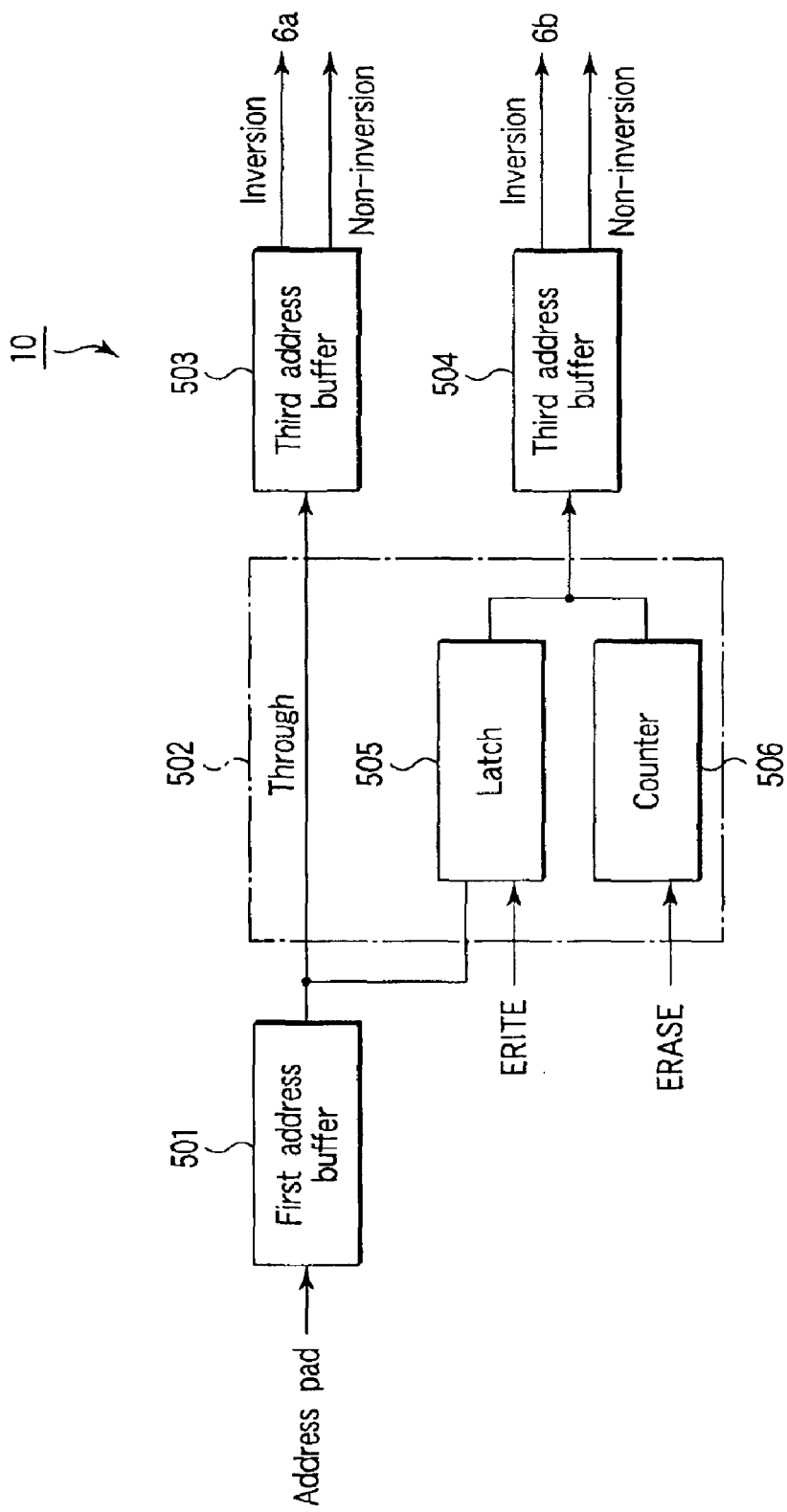
F I G. 7

300, 59) 0)
SEMICONDUCTOR MEMORY DEVICE CAPABLE OF ERASING OR WRITING DATA IN ONE BANK WHILE READING DATA FROM ANOTHER BANK

CROSS-REFERENCE TO RELATED APPLICATIONS

This application is based upon and claims the benefit of priority from the prior Japanese Patent Application No. 2002-056365, filed Mar. 1, 2002, the entire contents of which are incorporated herein by reference.

BACKGROUND OF THE INVENTION

1. Field of the Invention

The present invention relates to a semiconductor memory device such as an electrically data erasable/rewritable non-volatile semiconductor memory device (e.g., EEPROM). In particular, the present invention relates to a batch erasable semiconductor memory device such as a flash memory, which is capable of erasing or writing data in a specified block in a memory-cell array while reading data from other specified block.

2. Description of the Related Art

In a recent advanced flash memory, there has been proposed a so-called RWW (Read While Write) type memory system. In order to reduce the number of memory chips required for the system, the memory system makes it possible to read data in a specified memory area while to write or erase data in other specified area.

For example, JPN. PAT. APPLN. KOKAI Publication No. 2001-325795 publicly opened on Nov. 22, 2001 discloses a semiconductor device capable of realizing the following flash memory. The flash memory can simultaneously execucte the data write or erase operation in one or more banks and the data read operation in other bank.

In the flash memory having the simultaneously executable function described above, when erasing data at a unit of memory block, each memory block is provided with the corresponding block selection register. Of the block selection registers, specified block selection registers corresponding to erase object section blocks specified across a plurality of banks hold erase flags. The logical sum of the erase flags of the block selection registers corresponding to memory blocks erase-specified across two or more banks is obtained, to generate a busy signal for all erase object selection blocks.

When serially erasing data from all erase selection blocks at a unit of block, the block selection register corresponding to each erase-object selection block is configured in the following manner. The block selection registers hold or latch erase flags corresponding to all erase-object selection blocks when an erase command is inputted, and the latched flags are reset after the erase operation of all erase-object selection blocks across several banks is completed.

Therefore, when serially erasing data from the erase-object selection blocks selected across a plurality of banks at a unit of block, there is the following problem. Thus, when the erase operation in a bank having the erase-object selection blocks is completed, while the erase operation in the remaining erase-specified banks is not completed, data read is impossible until the erase operation of all erase object selection blocks specified in the remaining banks is completed.

This is disadvantageous in the case of carrying out a test process of reconfirming whether or not cell data of each erase-object selection block is normally erased. In other words, data read from a desired bank including erase-object selection blocks is impossible even if the data of all the erase-object selection blocks in this bank is completely erased, until all erase operations of remaining erase-object selection blocks of all specified banks are completed. This causes much time loss in the test process; as a result, test time becomes long.

BRIEF SUMMARY OF THE INVENTION

According to one aspect of the present invention, there is provided a semiconductor memory device comprising:

a memory cell array containing a plurality of banks each having one or more blocks;

a data erase circuit configured to erase data from selected blocks in banks at a unit of block;

a data read circuit configured to read data from memory cells provided in one bank of the banks; and an automatic multi-block erase circuit configured to enable the data read circuit, when data erase operation for all erase-object blocks in the one bank is completed, while continuing a data erasing operation of a next erase-object block included in another bank.

BRIEF DESCRIPTION OF THE SEVERAL VIEWS OF THE DRAWING

FIG. 3 is a circuit diagram showing another configuration of an address line switch circuit section included in an address line switch circuit of each core shown in FIG. 1;

FIG. 7 is a block diagram showing the configuration of an address buffer shown in FIG. 1;

DETAILED DESCRIPTION OF THE INVENTION

The structure of the semiconductor memory device according to one embodiment of the present invention will be described below in detail with reference to the accompanying drawings.

Figure 1:
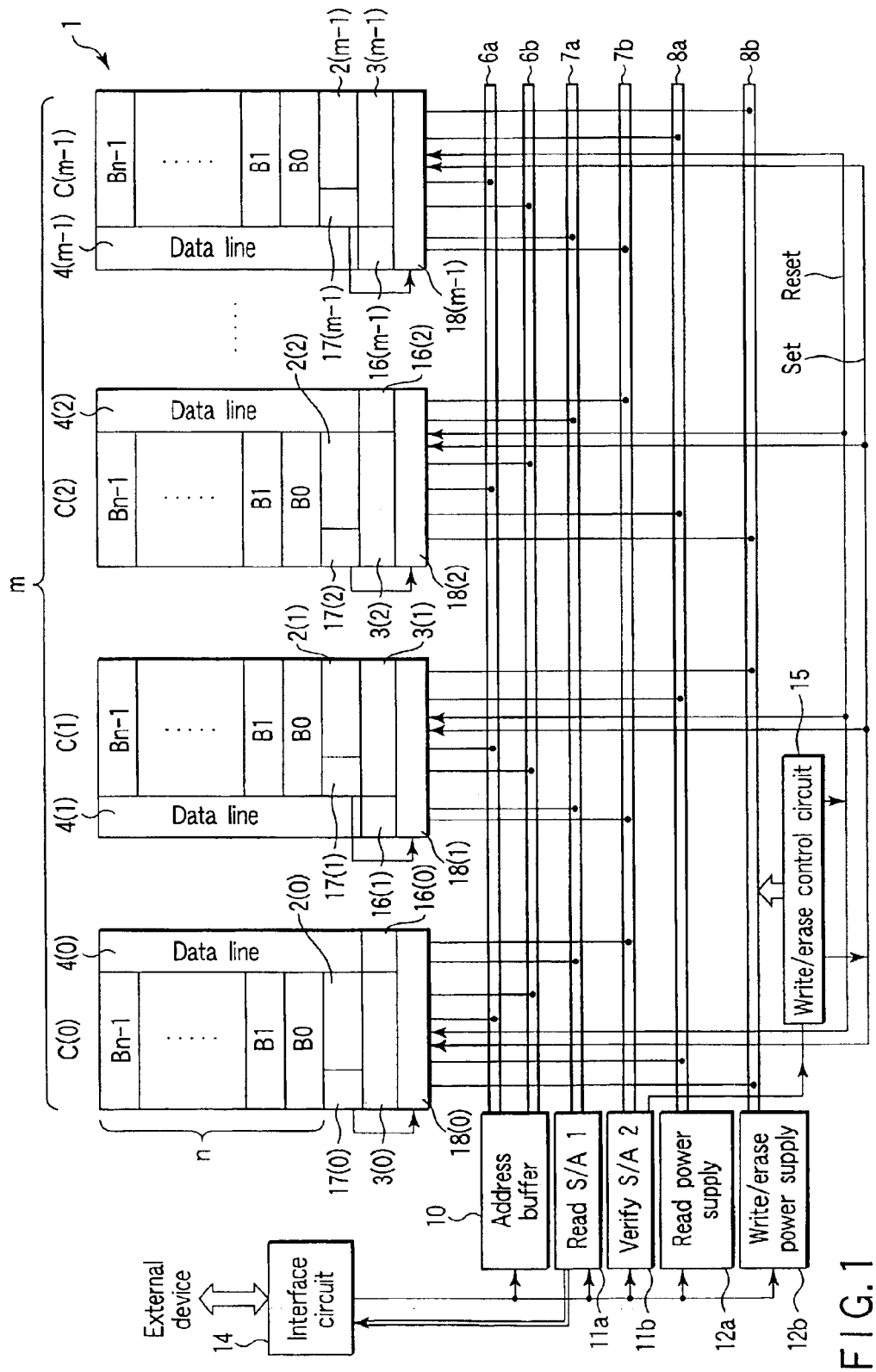
FIG. 1 is a block diagram showing the entire configuration of a semiconductor memory device according to one embodiment of the present invention.

FIG. 1 is a block diagram showing the chip structure of a flash memory according to one embodiment of the present invention.

In FIG. 1, a memory cell array 1 comprises m cores C (0) to C (m-1), each of which is composed of n blocks B0 to B (n-1) arrayed. Each of blocks B0 to B (n-1) is the data erase minimum unit, and includes a plurality of arrayed memory cells. Each of the memory cells is a non-volatile memory cell having a stacked gate structure, for example. Here, each of cores C (0) to C (m-1) is defined as a set of one or more blocks. However, in the embodiment of FIG. 1, each core comprises n blocks B0 to B (n-1). In this case, one core forms one bank; however, a plurality of cores may form one bank.

The first core C(0) is provided with a row/column decoder 2(0), an address line/power line switch circuit (address SW) 3(0), a local data line 4(0), a data line switch circuit (data line SW) 16(0), a block decoder circuit 17(0) and a switch control circuit 18(0).

The row/column decoder 2(0) includes a row decoder and a column decoder for selecting the memory cells provided in the core C(0) which is decoded by the switch circuit 3(0). The address line/power line switch circuit 3(0) makes a switchover of the address line and the power line. The row/column decoder 2(0) is additionally provided with the block decoder circuit 17(0), which will be described later. The address line/power line switch circuit 3(0) and the data line switch circuit 16(0) are connected with the switch control circuit 18(0), which will be described later. The decoded output from the block decoder circuit 17(0) is supplied to the switch control circuit 18(0).

Other cores C (1) to C (m-1) are formed in the same manner as the first core C (0); therefore, the same or similar reference numerals are used, and the explanation is omitted.

The circuit shown in FIG. 1 is provided with a first address bus line (read address bus line) 6a and a second address bus line (write/erase address bus line) 6b in common to all of m cores C (0) to C (m-1) of the memory cell array 1. The first address bus line 6a is used to select a memory cell in the data read operation; on the other hand, the second address bus line 6b is used to make an address designating operation required for data write or erase.

The circuit shown in FIG. 1 is further provided with a first data bus line (read data bus line) 7a and a second data bus line (write/erase data bus line) 6b in common to all of m cores C (0) to C (m-1). The first data bus line 7a is used for the data read operation; on the other hand, the second data bus line 7b is used for data write or erase operation.

The data bus lines 7a and 7b are provided with a first sense amplifier circuit (read sense amplifier circuit) 11a, and a second sense amplifier circuit (verify sense amplifier circuit) 11b, respectively. The first sense amplifier circuit 11a is used for the data read operation; on the other hand, the second sense amplifier circuit 11b is used for the verify read operation in data write or erase.

The circuit shown in FIG. 1 is further provided with a first power line (read power line) 8a and a second power line (write/erase power line) 8b in common to all of m cores C (0) to C (m-1). The first power line 8a is supplied with a read power-supply potential from a read power supply 12a; on the other hand, the second power line 8b is supplied with a data write or erase power-supply potential from a write or erase power supply 12b. In the data read operation, a voltage stepped up by a predetermined voltage from that of a power source voltage Vcc is given to the read power line 8a from the read power supply 12a. The above voltage is supplied to a control gate of a non-volatile memory cell transistor, so that high-speed read can be achieved.

The circuit shown in FIG. 1 is further provided with an address buffer circuit 10 for supplying an address signal to the read address bus line 6a and the write/erase address bus line 6b, and an interface circuit 14 for making interface with the external device. The circuit shown in FIG. 1 is further provided with a write/erase control circuit 15, which supplies a set signal SET and a reset signal RESET from the switch control circuit 18(0) to 18(m-1) when receiving the output from the verify sense amplifier S/A2.

The following is a brief description on the operation of the flash memory having the above configuration shown in FIG. 1.

The address signal inputted from the external device is supplied to the address buffer circuit 10 via an address input circuit included in the interface circuit 14. The address buffer circuit 10 supplies read address signal and write or erase address signal to each of the address bus lines 6a and 6b in accordance with a specified operation mode. The address signals supplied to the address bus lines 6a and 6b are supplied to the switch circuits 3(0) to 3(m-1) via switch control circuits 18(0) to 18(m-1), respectively, and are selectively transferred to the row/column decoders 2(0) to 2(m-1) of the cores C(0) to C(m-1). The switch circuits 3(0) to 3(m-1) selectively switch the power lines 8a and 8b via the switch control circuits 18(0) to 18(m-1) so that power can be supplied to the row/column decoders 2(0) to 2(m-1), in each of cores C(0) to C(m-1).

In each of cores C(0) to C(m-1), the data line switch circuits 16(0) to 16(m-1) control the connection of the local data lines 4(0) to 4(m-1). In the data read operation, the local data lines 4(0) to 4(m-1) are selectively connected to the read data bus line 7a; on the other hand, in the data write or erase operation, selectively connected to the write/erase data bus line 7b.

More specifically, the data of the selected memory cell of each of the cores C(0) to C(m-1) is read via the corresponding one of local data lines 4(0) to 4(m-1). Thereafter, the data thus read out is transferred to the data bus line 7a or 7b via the data line switch circuits 16(0) to 16(m-1). Then, the data is detected and amplified by the read sense amplifier circuit 11a or the verify sense amplifier circuit 11b.

The read result of the verify sense amplifier circuit 11b is sent to the write/erase control circuit 15 so that it can be determined whether or not write or erase is sufficient. If the write or erase is not sufficient, the control for rewrite or re-erase is carried out.

The write/erase control circuit 15 also generates a set signal SET and a reset signal RESET when the data erase mode is set for erasing data from specified blocks. The set signal SET is used to set block selection registers corresponding to erase-specified blocks, and the reset signal RESET is used to reset a block selection register corresponding to a block from which data erase is completed. The set signal SET and reset signal RESET are supplied to switch control circuits 18(0) to 18(m-1). The functions of the signals SET and RESET will be described later.

In the first embodiment of FIG. 1, data read and data write or erase can be carried out simultaneously, by controlling independent address bus lines 6*a* and 6*b*, data bus lines 7*a* and 7*b*, sense amplifier circuits 11*a* and 11*b*, and power circuits 12*a* and 12*b*.

The following is a detailed description on the operation when data write and data read are simultaneously carried out. That is, externally supplied data is written to the core C(0) and data stored in a core other than the core C(0) is read.

When a selection address signal of the core C(0) is inputted and a write command is inputted from the external device of the chip, the interface circuit 14 identifies the write command of the selected core C(0), and thereafter, a write flag is set.

In this state, since the reset signal RESET is delivered from the write/erase control circuit 15, the address signal and the data is supplied to the switch circuit 3(0) and the data line switch circuit 16(0) via the switch control circuit 18(0). According to the write flag, the switch circuit 3(0) of the core C(0) is controlled, and the address signal of the write/erase address bus line 6*b* is inputted to the row/column decoder 2(0) of the core C(0), so that the power of the write/erase power supply 12*b* is supplied thereto. Further, under the control of the data line switch circuit 16(0), the local data line 4(0) of the core C(0) is connected to the write/erase data bus line 7*b* connected to the verify sense amplifier circuit 11*b*.

As described above, the address bus lines 6*a* and 6*b*, data bus lines 7*a* and 7*b*, and power lines are set. Accordingly, in the core C(0), a stepped-up write voltage is applied to a selected word line in the core C(0), and a high or low voltage is applied to a bit line from the write/erase control circuit 15 in accordance with the write data. By doing so, if the memory cell has a floating gate type MOS transistor structure in this embodiment, hot electrons are injected into the floating gate of the selected memory cell so that data write can be achieved.

When one-time write is completed, data is read from the corresponding address and, thereafter, is detected by the verify sense amplifier circuit 11*b*. Then, the detected data is supplied to the write/erase control circuit 15 to make verify judgment. If the write is sufficient, the write operation is completed. If the write is not sufficient, additional write is carried out repeatedly.

During the above write operation to the core C(0), in other arbitrary core, for example, in the core C(1), data read is possible. More specifically, in the core C(1) including the memory cell storing data to be read, a reset signal RESET is applied from the write/erase control circuit 15. Therefore, the address signal inputted from the external device is supplied to the read address bus line 6*a* via the switch control circuit 18(1), and is further supplied to the row/column decoder 2(1), together with the power from the read power supply 12*a*. In the similar manner, the data line 4(1) is connected to the read data bus line 7*a* via the switch circuit 16(1).

The data read from the selected memory cell of the core C(1) is detected and amplified by the read sense amplifier circuit 11*a* via the read data bus line 7*a*. The data thus read is outputted to the external device of the chip via the interface circuit 14.

Namely, in a core other than the core C(0) carrying out the data write operation, that is, in core C(2), core C(3) or core C(m-1), for example, data can be arbitrarily read. However, as will be described later, data read is inhibited in the core C(0) by an output of the switch control circuit 18(0), during an address signal for carrying out the data write is inputted in the core C(0).

As described above, during the data write is executed in the core C(0), a busy signal is outputted to show that the core C(0) is carrying out the write operation to the external device, thus the read request for the core C(0) is inhibited.

In this case, no address signal is inputted to the row/column decoder 2(2) to 2(m-1) of the cores C(2) to C(m-1) having no data write request nor data read request, and the corresponding data bus line is not connected thereto.

On the other hand, the operation of simultaneously carrying out data erase and read is basically the same as the above case of carrying out data write and read. For example, the following is a description on the operation when erasing data from the selection block of the core C(0) and reading cell data included in another core.

When a selection address signal of a specified block included in the core C(0) is inputted and erase command is inputted from the external device of the chip, a block selection signal is outputted from a selected block decoder in the block decoder circuit 17(0) to the switch control circuit 18(0), while the interface circuit 14 determines the erase command to set an erase flag. According to the erase flag and an output from the switch control circuit 18(0), the switch circuit 3(0) and the data line switch circuit 16(0) in the core C(0) is controlled. Then, the address signal on the write/erase address bus line 6*b* is inputted to the row/column decoder 2(0) of the core C(0) and the erase power-supply potential of the write/erase power supply 12*b* is supplied to the row/column decoder 2(0). According to the control by the data line switch circuit 16(0), the data line 4(0) of the core C(0) is connected to the write/erase data bus line 7*b* connected to the verify sense amplifier circuit 11*b*.

As described above, the address bus lines 6*a* and 6*b*, data bus lines 7*a* and 7*b*, and power lines 8*a* and 8*b* are set, and thereby, a negative voltage is applied to all of word lines of the selected block or blocks in the selected core C(0). Therefore, bit lines thereof become an open state, and a high voltage for data erase is applied to a source line. As a result, data is erased at a unit of block in the selected core C(0).

When one-time data erase is completed, data from the erase-object memory cell is read, and is detected by the verify sense amplifier circuit 11*b*. Then, the write/erase control circuit 15 determines whether the erase operation is sufficient. If the erase is sufficient, the erase operation is completed. If the erase is not sufficient, additional erase is carried out.

When data read request is made with respect to an arbitrarily selected core during data erase to the core C(0) is executed, data read is carried out in the selected core.

In the embodiment, the core is defined as a set or group of blocks each of which is also defined as a unit of data erase, as described before. More specifically, the core is a group of several blocks having the address lines, power lines and data lines in common, and defined as a set of several blocks in which, while access is made to one of the blocks, access to any one of the remaining blocks is inhibited.

The following is a description on the configuration of each circuit shown in FIG. 1.

Figure 2:
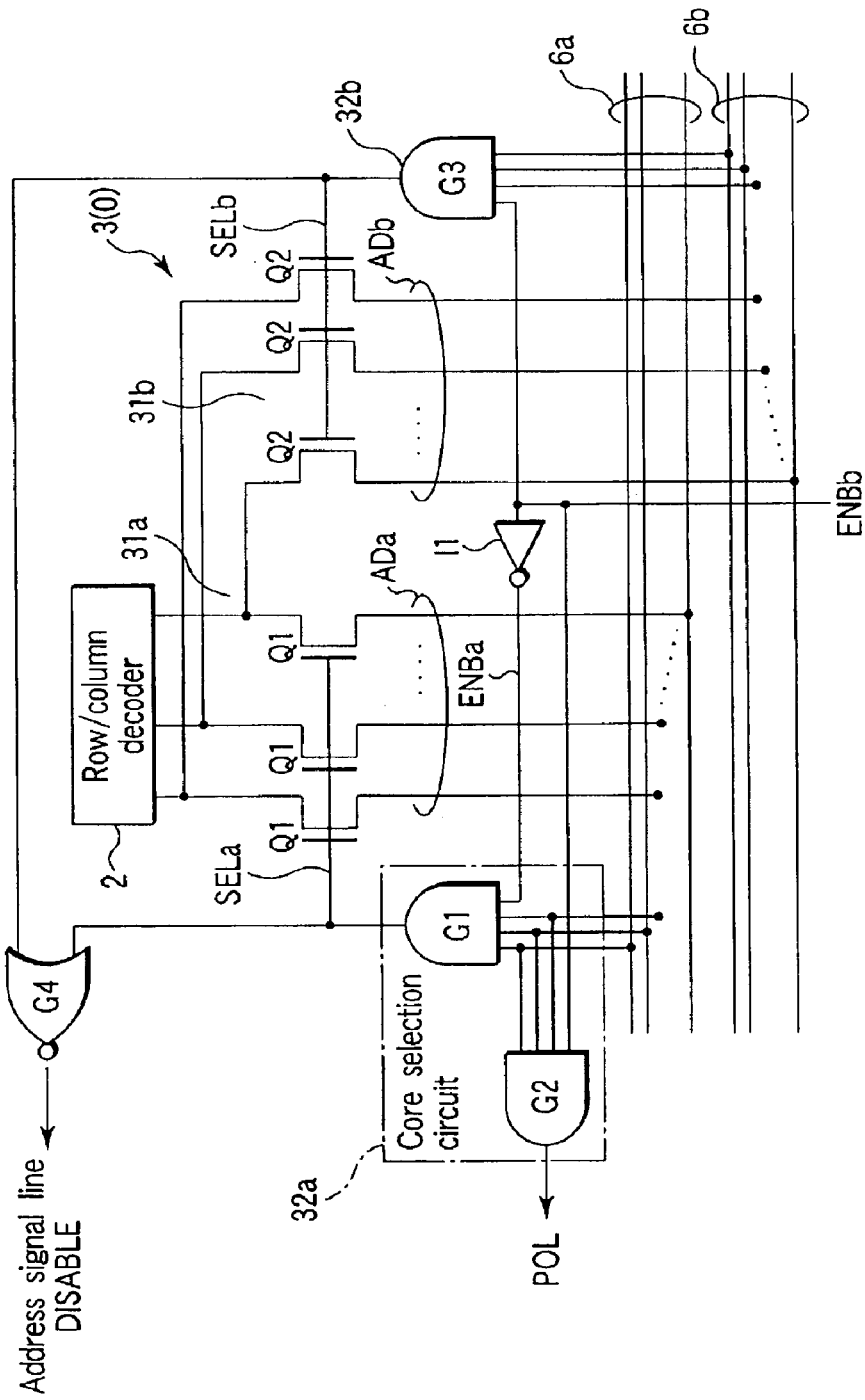
FIG. 2 is a circuit diagram showing the configuration of an address line switch circuit section included in an address line switch circuit of each core or bank shown in FIG. 1.

FIG. 2 shows a configuration of an address line switch circuit section included in the address line switch circuit 3(0) of the first core C(0), for example, shown in FIG. 1. In the circuit configuration shown in FIG. 2, the switch control circuit 18(0) connected between the address bus lines 6a and 6b and the address line switch circuit 3(0) shown in FIG. 1 is omitted. The address line switch circuits in other cores have the similar configuration as that shown in FIG. 2.

In FIG. 2, the switch circuit 3(0) has two selection switch groups 31a, 31b, and core selection circuits 32a, 32b for selectively driving these switch groups 31a, 31b. The core selection circuits 32a and 32b are activated by enable signals ENBa and ENBb, respectively.

The enable signal ENBb is a write or erase enable signal, which becomes "H" when write or erase command described later is inputted. The enable signal ENBa obtained by inverting the enable signal ENBb by an inverter 11 is a read enable signal, which becomes "H" when data is read.

One core selection circuit 32b comprises an AND gate G3, which is activated by the enable signal ENBb="H" in data write or erase. To the AND gate G3 a core selection address signal from the write/erase address bus line 6b is input, and a core selection signal SELb="H" is delivered to a selected core. According to the control of the core selection signal SELb, the selection switch group 31b is turned on in data write or erase. By doing so, a write or erase address signal ADb on the write/erase address bus line 6b is supplied to the row/column decoder 2(0) of the selected core C(0), for example.

The other core selection circuit 32a comprises an AND gate G1 activated by the read enable signal ENBa. The AND gate G1 receives a core selection address signal from the read address bus line 6a. When the enable signal ENBb is "H", the enable signal ENBa is "L", and the output of the AND gate G1, that is, a core selection signal SELa becomes "L" when the core C(0), for example, is selected as an object in which data write or erase is to be executed. In this case, the selection switch group 31a holds an off state. When the core C(0) is selected as data read object, the selection signal SELa becomes "H", and thereby, the selection switch group 31a is tuned on so that an address signal ADa of the read address bus line 6a is supplied to the row/column decoder 2(0).

In the embodiment, a so-called glitch is inhibited. That is, in one core, the write or erase core selection signal SELb and the read core selection signal SELa do not become "H", simultaneously. Therefore, when data write or erase is carried out in a certain core, core C(0), for example, data read is not carried out in the same core C(0).

The core selection circuit 32a is provided with an AND gate G2, which is supplied with the same read core selection address signal as the AND gate G1. The AND gate G2 is a data poling signal generator, which outputs a signal denoting that, when a read request is made to the core C(0) in which the data writing or erasing is executed, for example, the core C(0) is writing or erasing data. The write or erase enable signal ENBb is inputted to the AND gate G2 as an activation signal. Therefore, when a read request is made to the core C(0) writing or erasing data, the AND gate G2 outputs a data poling signal POL="H" while holding the core selection signal SELa="L".

When the above two core selection signals SELa and SELb are both "L", it means that the corresponding core is in a non-selection state. In this case, a NOR gate G4 detects the above non-selection state, and outputs a signal DISABLE for non-activating the address lines of the non-selected core.

Figure 4:
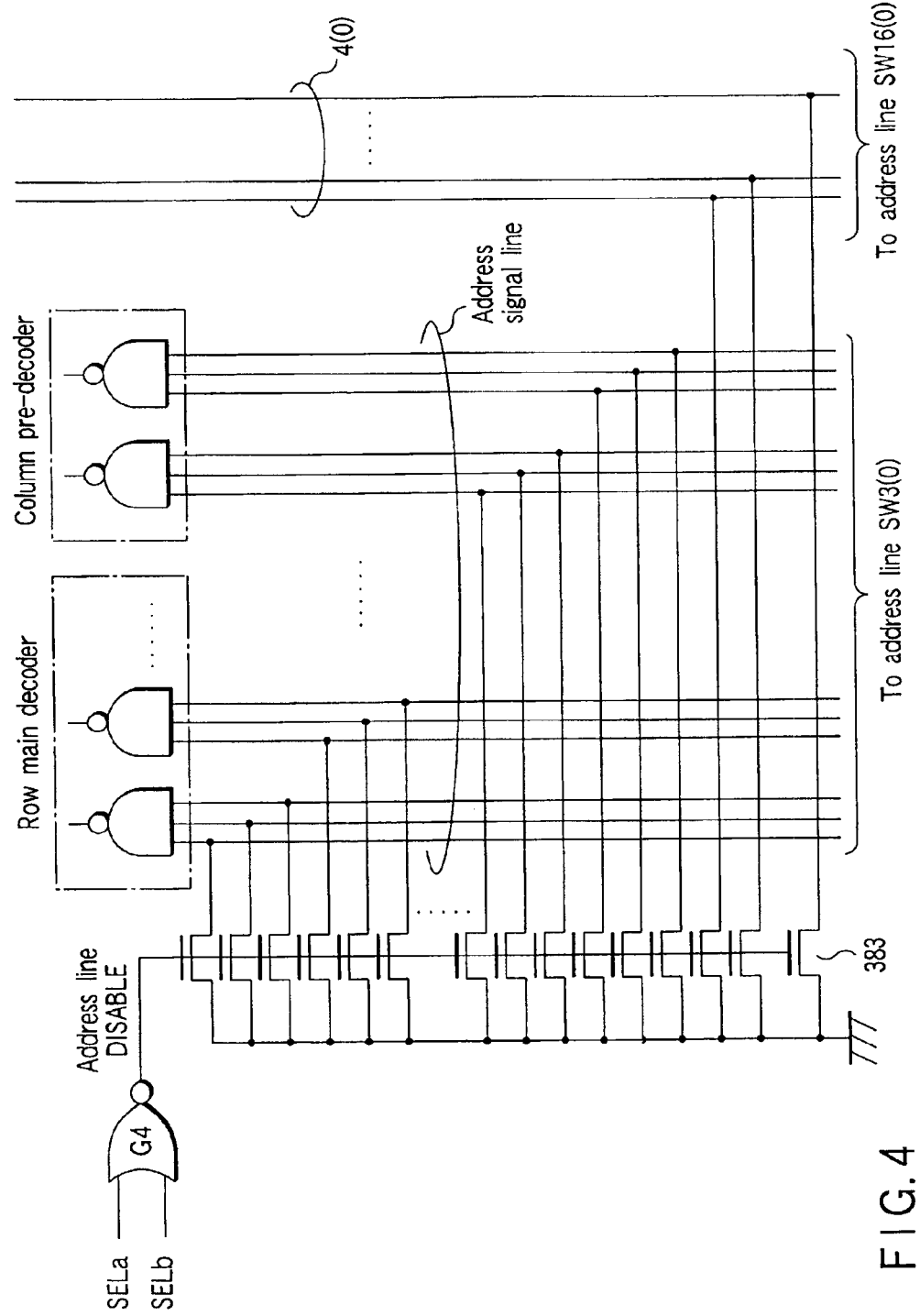
FIG. 4 is a circuit diagram showing the configuration of a circuit for forcedly grounding an address signal line in a non-selected core shown in FIG. 2 and FIG. 3 by a signal DISABLE.

FIG. 4 shows the configuration of a circuit for forcedly grounding the address signal lines and the data lines of the non-selected core shown in FIG. 1 by the signal DISABLE formed in the circuit of FIG. 2.

In the core C(0), for example, as shown in FIG. 4, the core C(0) is provided with a short-circuiting transistor group 383, which grounds the address signal lines and the data lines. The short-circuiting transistor group 383 is controlled by the NOR gate G4. When the core C(0) is in the non-selection state, the signal DISABLE becomes "H"; therefore, the short-circuiting transistor group 383 is turned on so that the electric charge on all address and data lines of the core C(0) is discharged.

The above operation serves to prevent the address and data lines from becoming at a floating state in the non-selected core C(0). As a result, it is possible to prevent malfunction by electrostatic noise, breakdown of each gate insulting film, data corruption, etc. This operation is true for all the non-selected cores.

In the address line switch circuit shown in FIG. 2, when two core selection signals SELa and SELb are both "L", both address line switch groups 31a and 31b turn off so that undesired interconnection or wiring capacitance in the non-selection cores is not connected to the read address bus line 6a and the write/erase address bus line 6b. In this case, the following method may be employed such that the address line switch groups 31a and 31b are controlled by the enable signals ENBa and ENBb, respectively. One example of the above method is shown in FIG. 3.

FIG. 3 shows another configuration of the address line switch circuit section shown in FIG. 2 included in the address line switch circuit 3(0) of the core C(0), for example, as shown in FIG. 1.

In the address line switch circuit 3(0), when write or erase is carried out in the corresponding core C(0), the address line switch group 31b turns on so that the write or erase address signal ADb of the write/erase address bus line 6b is supplied to the row/column decoder 2(0). On the contrary, when write or erase is not carried out in the corresponding core C(0), the address line switch group 31a always turns on so that the read address signal ADa of the read address bus line 6a is supplied to the row/column decoder 2(0). Thus, when the core C(0) is in the non-selection state, the disable signal DISABLE becomes "H", and the row/column decoder 2(0) becomes at all non-selection state; therefore, the data line is also discharged.

According to the above-mentioned circuit configuration, there is no need of turning on the address line switch group 31a in data read; therefore, it is possible to reduce switching time, and to achieve high-speed data read.

Figure 5:
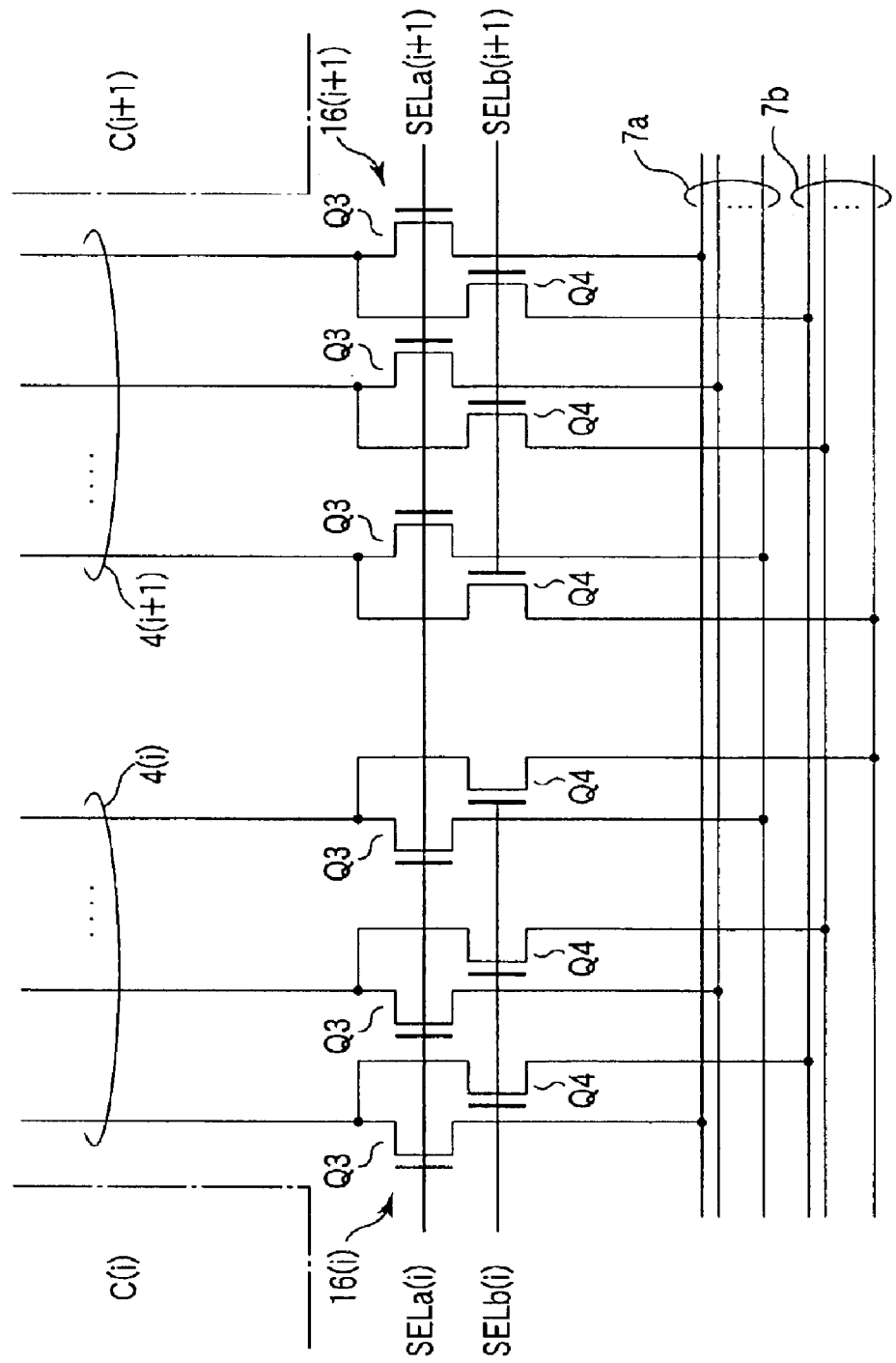
FIG. 5 is a circuit diagram showing the configuration of a data line switch circuit formed between adjacent two cores shown in FIG. 1.

FIG. 5 shows the configuration of the data line switch circuits 16(i) and 16(i+1). In this case, adjacent cores i and (i+1) of FIG. 1 such as cores C(0) and C(1) are taken as an example. The data line switch circuits 16(i) and 16(i+1) make the switchover of connection between the local data lines 4(i) and 4(i+1), and the read data bus line 7a and the write/erase data bus line 7b. In this case, though not shown in FIG. 5, switch control circuits 18(i) and 18(i+1) such as those 18(0) and 18(1) are connected between the data bus lines 7a and 7b and the data line switch circuit 4(i) and 4(i+1) as shown in FIG. 1.

In FIG. 5, a group of NMOS transistors Q3 is controlled by the output of the above core selection circuit 32a, that is, the core selection signals SELa(i) and SELa(i+1) so that the connection or non-connection between the local data lines 4(i), 4(i+1) and the read data bus line 7a is switched. A group of NMOS transistors Q4 is controlled by the output of the above core selection circuit 32b, that is, the core selection signals SELb(i) and SELb(i+1) so that the connection or non-connection between the local data lines 4(i) and 4(i+1) and the write/erase data bus line 7b is switched.

More specifically, when a certain core C(i) is in the data write or erase mode, the core selection signal SELb(i) is "H" in the core C(i). Thus, the transistor group Q4 in the core C(i) turn on so that the local data line 4(i) is connected to the write/erase data bus line 7b.

Conversely, when the certain core C(i) is in the data read mode, the core selection signal SELa(i) in the core C(i) is "H". Thus, the transistor group Q3 in the core C(i) turn on so that the local data line 4(i) is connected to the read data bus line 7a.

Figure 6:
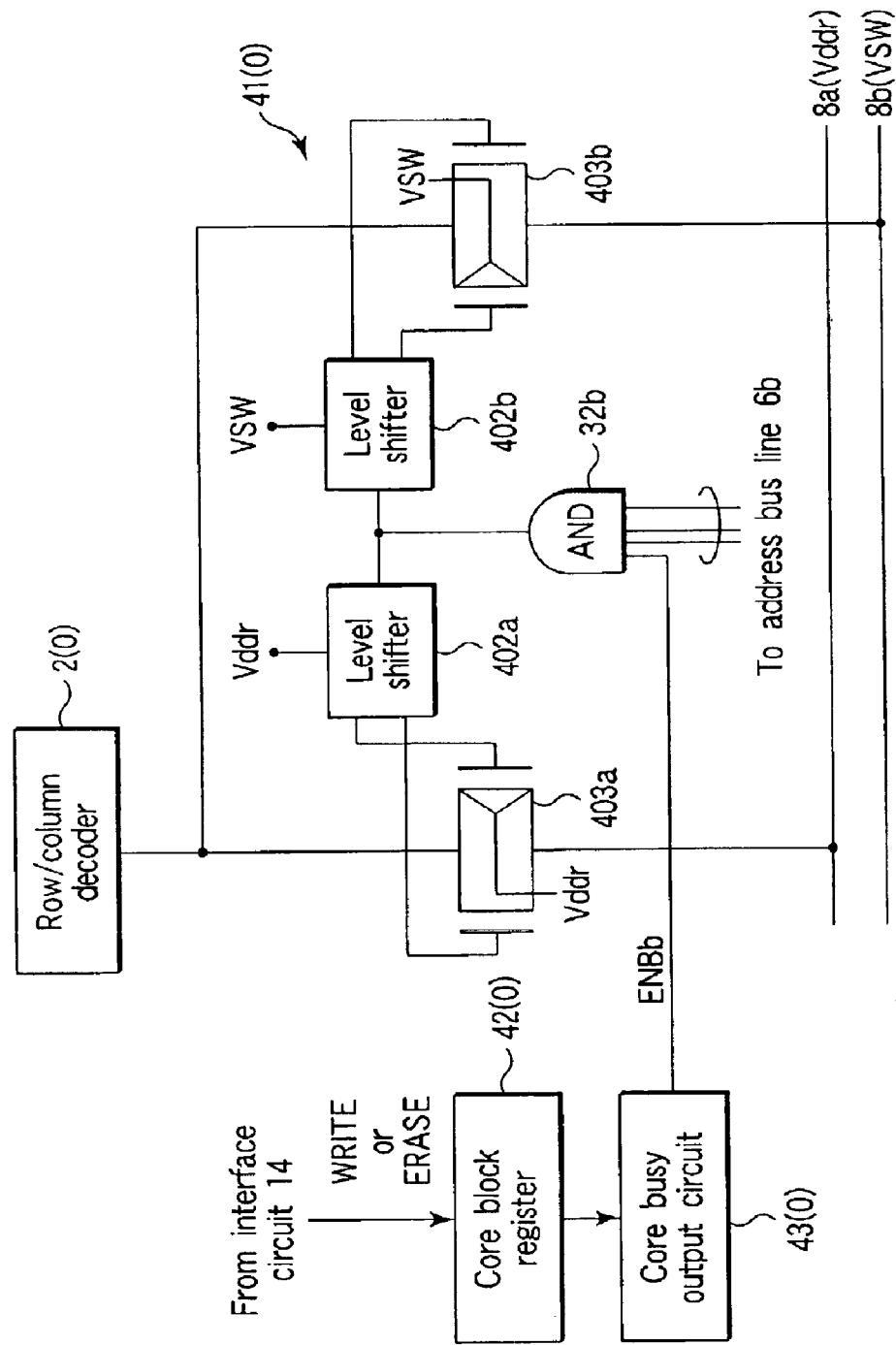
FIG. 6 is a circuit diagram showing the configuration of a power line switch circuit section included in the address line switch circuit of each core shown in FIG. 1.

FIG. 6 shows the configuration of a power line switch circuit section 41(0) included in the address line switch circuit 3(0) of the core C(0) shown in FIG. 1, for example. In FIG. 6, there is shown a generation path of the enable signals ENBa and ENBb, which have been omitted in FIG. 2.

The power line switch circuit section 41(0) has level shifters 402a and 402b, and transfer gates 403a and 403b. The level shifters 402a and 402b are selectively activated by the core selection circuit 32b included in the switch circuit 3(0) of FIG. 2. The transfer gates 403a and 403b are controlled by the output of the level shifters 402a and 402b, respectively. The transfer gates 403a and 403b selectively connect the read power line 8a and the write/erase power line 8b to the row/column decoder 2, respectively, via the switch control circuit 18(0) shown in FIG. 1.

For instance, when the output of the core selection circuit 32b, that is, the core selection signal SELb is "H", in other words, when the core C(0) is in the data write or erase mode, the level shifter 402b is activated. By doing so, the transfer gate 403b turns on by a control signal of which the voltage level is shifted by the level shifter 402b. Therefore, the write or erase power-supply potential (e.g., stepped-up potential VSW) from the write/erase power line 8b is supplied to the row/column decoder 2(0).

When the core C(0) is in the read mode, the core selection signal SELb shown in FIG. 2 is "L"; in this case, the level shifter 402a is activated so that the transfer gate 403a is turned on. By doing so, the read power-supply potential Vddr from the read power line 8a is supplied to the row/column decoder 2(0) via the transfer gate 403a.

In the interface circuit 14, data write signal WRITE or erase signal ERASE obtained by decoding the command signal is held in a core block register 42(0) prepared for the core C(0) as information denoting which block or blocks in the core C(0) is selected as write object or erase object, for example. Accordingly, the core block register 42(0) includes block registers corresponding to the number of blocks in the core C(0) as will be described later. Based on the information in the core block register 42(0), a core busy output circuit 43(0) outputs an enable signal ENBb="H" as a busy output showing that the core C(0) is in the write or erase mode. The above core block register 42(0) and core busy output circuit 43(0) will be described later in detail.

FIG. 7 shows the configuration of the address buffer 10 shown in FIG. 1.

The address buffer 10 has a three-stage structure, which comprises a first buffer stage 501, a second buffer stage 502 and third stage buffers 503 and 504. The first buffer stage 501 has a function of reducing noises of address signals supplied from the external device of the chip, and protecting the internal elements of the chip having a configuration of FIG. 1. The second buffer stage 502 passes through the supplied address signal so that the address signals can be supplied to the third buffer stage 503 and a latch circuit 505 in an intact state.

In the data read mode, an address signal passing through the second buffer stage 502 is converted into complementary signals in the third buffer stage 503, thereafter, supplied to the read address bus line 6a. In the data write operation, the address signal is held in the latch circuit 505 by the write signal WRITE until the operation is completed. The address signal is further supplied to the third buffer stage 504, and converted into complementary signals, thereafter, supplied to the write/erase address bus line 6b.

A counter circuit 506 included in the second buffer stage 502 increments an address in the verify operation by the erase signal ERASE in the data erase mode. That is, in the erase verify mode, the address signal successively updated by the counter circuit 506 is supplied to the write/erase address bus line 6b via the third buffer stage 504.

Figure 8:
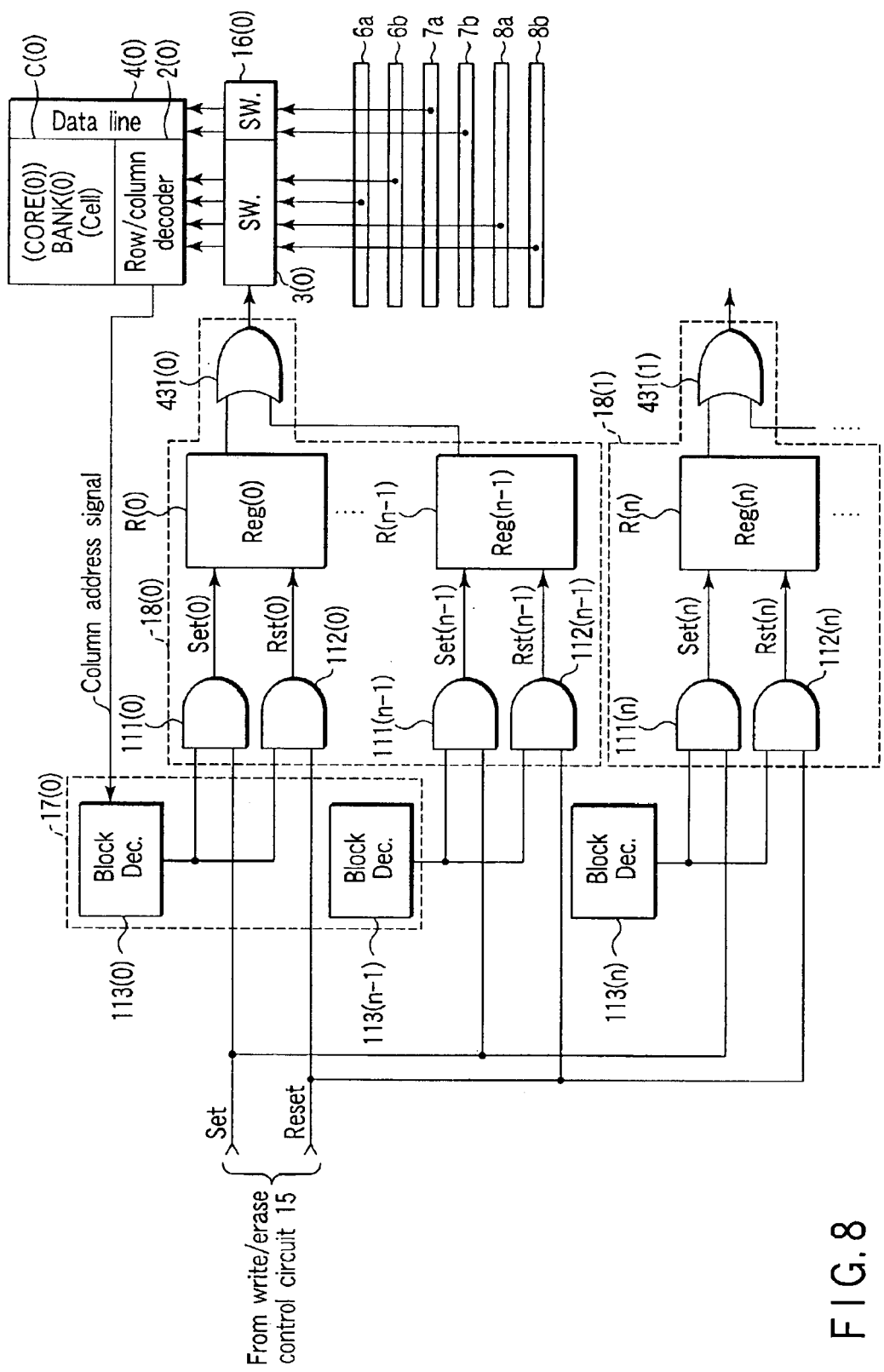
FIG. 8 is a block diagram showing block selection registers provided correspondingly to a plurality of blocks in the embodiment shown in FIG. 1 and a circuit for controlling input permission/inhibition of a set/reset signal for setting/resetting the block selection registers.

FIG. 8 shows a configuration of the switch control circuit 18(0) and a part of the switch control circuit 18(1) shown in FIG. 1. The switch control circuit 18(0) includes a configuration of the core block register 42(0) and the core busy circuit 43(0) shown in FIG. 6. The switch control circuits 18(1) to 18(m-1) are configured in the similar manner as the circuit 18(0).

In the switch control circuit 18(0) shown in FIG. 8, is shown a block selection registers R(0) to R(n-1) provided correspondingly to blocks in the first bank or core C(0). Set signals Set(0) to Set(n-1) and reset signals Rst(0) to Rst(n-1) are supplied to the block selection registers R(0) to R(n-1) from corresponding AND gates 111(0) to 111(n-1) and AND gates 112(0) to 112(n-1) for setting/resetting the block selection registers R(0) to R(n-1).

FIG. 8 further shows a part of the switch control circuit 18(1) including AND gates 111(n) and 112(n), block selection register R(n) and block decoder 113(n) in the second bank or core C(1). The register R(n) is controlled by the signals Set(n) and Rst(n).

Block designation signals from block decoders 113(0) to 113(n-1) forming the block decoder circuit 17(0) shown in FIG. 1 are supplied to set terminals of the AND gates 111(0) to 111(n-1) and AND gates 112(0) to 112(n-1). For example, when the block B0 in the core C(0) is designated in the data erase mode, a set signal or a gate control signal is supplied from the corresponding block decoder 113(0) to the set terminals of the AND gates 111(0) and 112(0). If another block or blocks are designated as data erase blocks in the core C(0), the corresponding set signals are supplied to the AND gates from the corresponding block decoders.

The other terminals of the AND gates 111(0) to 111(n-1) and AND gates 112(0) to 112(n-1) are supplied with set signals SET and reset signals RESET from the write/erase control circuit 15 in FIG. 1. The set signals Set are supplied to the AND gates 111(0) to 111(n-1) as well as to the AND gates 111(n). The reset signals Reset are supplied to the AND gates 112(0) to 112(n-1) as well as to the AND gates 112(n).

As shown in FIG. 8, when a set signal Set is input to the AND gates 111(0) to 111(n-1), and some of the block decoders 113(0) to 113(n) corresponding to the data erase specified blocks in the cores C(0) and C(1) output decode signals as permit/inhibit control signals for the set signal Set, corresponding block selection registers of the registers R(0) to R(n) are set.

Likewise, when a reset signal Reset is input to the AND gates 112(0) to 112(n), and some of the block decoders 113(0) to 113(n) corresponding to the data erase/write specified blocks in the cores C(0) and C(1) output decode signals as permit/inhibit control signals for resetting the block selection registers R0 to Rn, corresponding block selection registers of the registers R(0) to R(n) are reset.

The block selection registers R(0) to R(n) hold a data erase flag (or data write flag) during the data erase operation (or data write operation) when data erase (or data write) command for the corresponding block is inputted to the block decoders 113(0) to 113(n). The above block selection registers are equivalent to the core selection register 42(0) shown in FIG. 6 described before.

The logical sum of the outputs of the block selection registers R(0) to R(n-1) is taken by an OR circuit 431(0) equivalent to the core busy output circuit 43(0) shown in FIG. 6, and is used as a busy signal for controlling switch circuits 3(0) and 16(0) of the corresponding bank or core C(0). In the similar manner, the logical sum of the outputs of the block selection registers R(n) . . . in the switch control circuit 18(1) is taken by an OR circuit 431(1) which outputs a busy signal for controlling switch circuits 3(1) and 16(1) of the corresponding core C(1) shown in FIG. 1.

The switch control circuits 18(1) to 18(m-1) provided in correspondence with the cores C(1) to C(m-1) are configured in the similar manner as the switch control circuit 18(0) shown in FIG. 8. FIG. 8 shows a part of the circuit 18(1) corresponding to the core C(1) as an example.

When data erase operation is executed for a plurality of banks or cores, data stored in the specified blocks in the first core C(0), for example, is first erased. Thus, for example, when data in the specified block B(n-1) is erased, the data erase operation for the specified block B(n) in the next core C(1) follows. In this case, the AND gates 111(1) and 112(1) in the switch control circuit 18(1) are enabled to set the register R(n) by the input set signal Set. The output of the register R(n) is supplied to the OR gate 431(1) together with the outputs from the other registers. The output of the OR gate 431(1) is supplied to a control signal for the address switch 3(1) and data switch 16(1).

Accordingly, when the data erase operation in the core C(0) is completed in FIG. 8, the output of the OR gate 431(0) becomes LOW, for example. This LOW signal is supplied to the switch circuit 3(0) and 16(0) to change the operation mode of the switch circuits 3(0) and 16(0) to the data read mode. Thus, the data read from the core C(0) becomes possible, and the data erase operation for the core C(1) is continuously executed.

Figure 9:
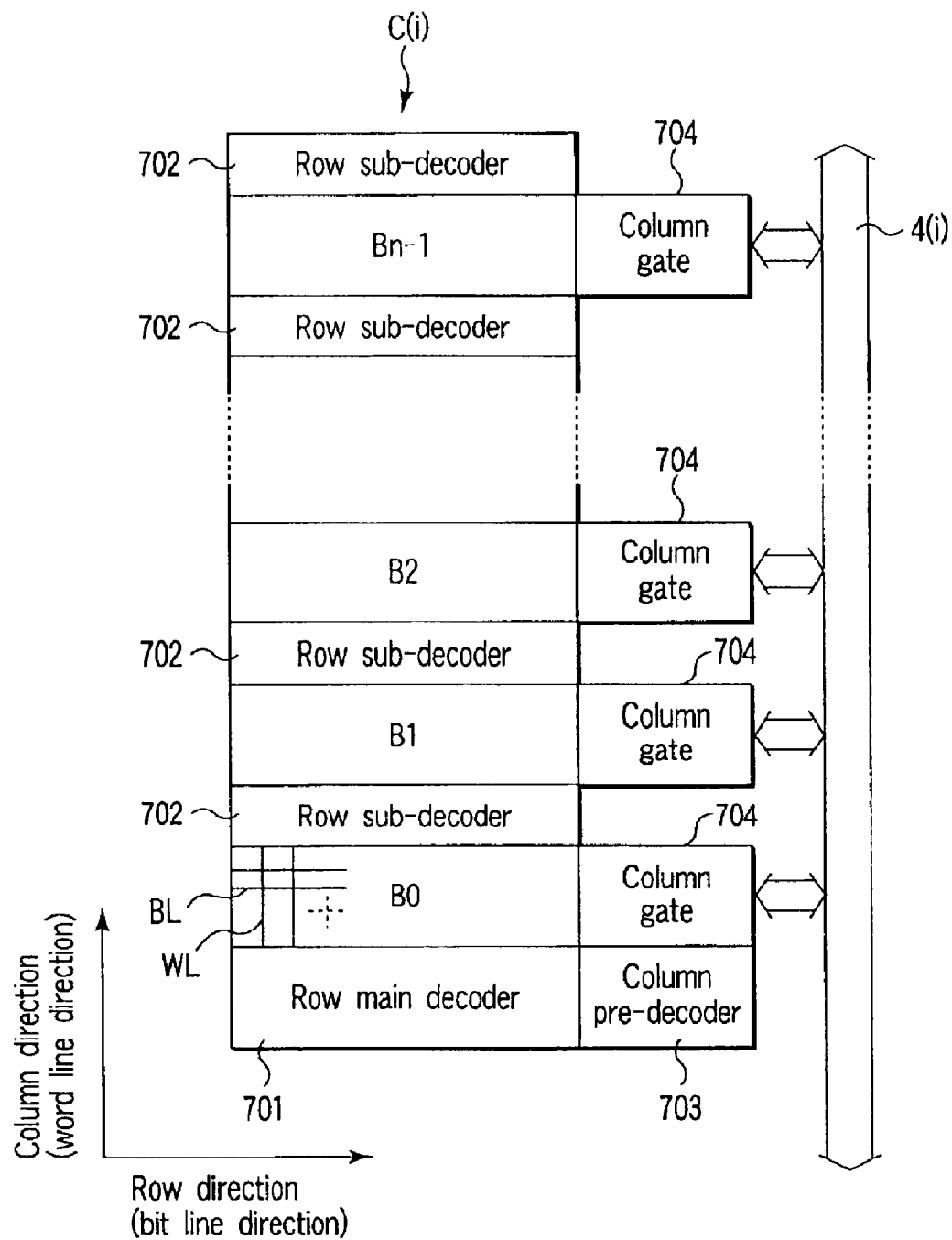
FIG. 9 is a block diagram showing the internal configuration of the core shown in FIG. 1.
Figure 10:
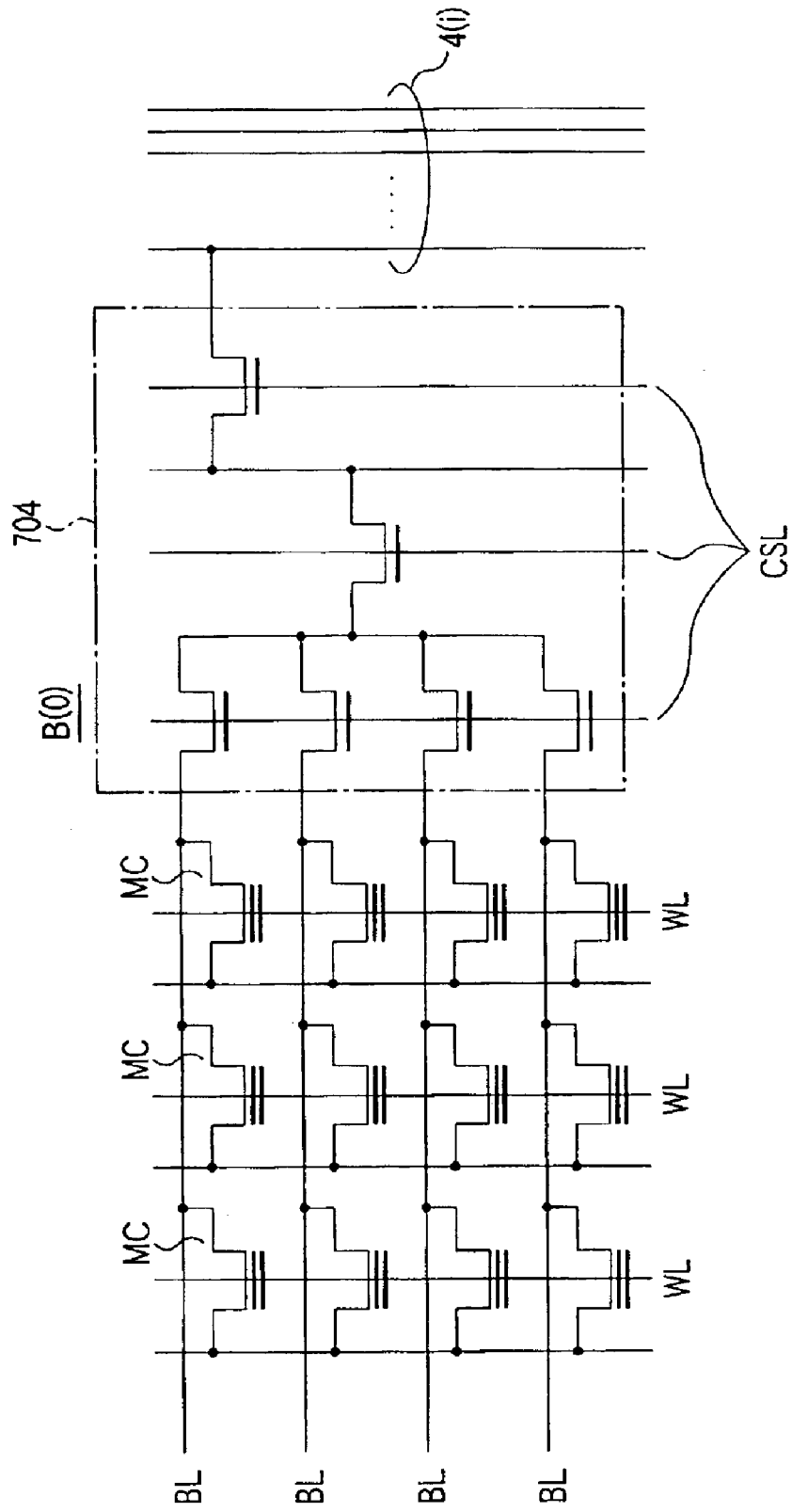
FIG. 10 is a circuit diagram showing the configuration of a group of memory cells in the block shown in FIG. 9.

FIG. 9 shows the configuration of one core C(i) (i=0 to m-1) shown in FIG. 1, and FIG. 10 shows the configuration of the one block B0, as an example, shown in FIG. 9.

As depicted in FIG. 10, the block B0 shown in FIG. 9 is configured in a manner that bit lines BL and word lines WL intersect each other, and memory cells MC are arranged at the intersected portions. Each of the blocks B0 to Bn-1 is configured in the similar manner as the block B0 and is used as the unit of batch erase. In FIG. 9, a main row decoder 701 for selecting a word line is arranged at the end portion of the blocks B0 to Bn-1 arrayed, and row sub-decoders 702 are interposed between the blocks B0 and B1, B1 and B2 and the like. A column decoder is composed of column gates 704 which are arranged at the end portions of bit lines of the respective blocks B0 to Bn-1 and select the bit lines, and a common column pre-decoder 703.

Figure 11:
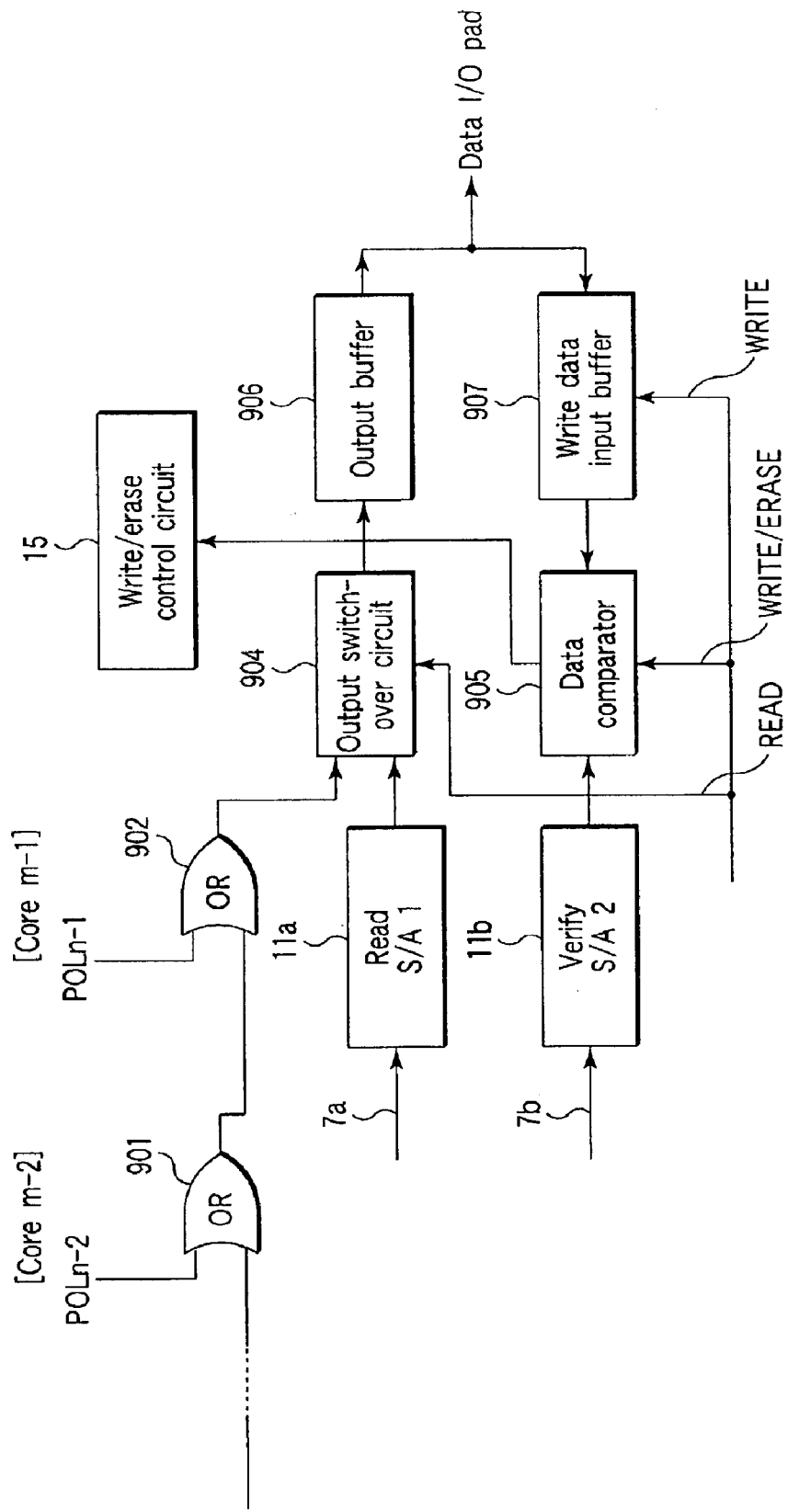
FIG. 11 is a circuit diagram showing the configuration of an input/output circuit arranged between read and verify sense amplifier circuits shown in FIG. 1 and an external input/output pad.

FIG. 11 shows the configuration of an input/output circuit arranged between the read and verify sense amplifier circuits 11a and 11b shown in FIG. 1 and an external input/output pad provided in the interface circuit 14.

In FIG. 11, OR gates 901 and 902 constitute a data poling output circuit for successively adding data poling signals POLi (i=0 to m-1) outputted by the core selection circuit 32a of each core described in FIG. 2 and for outputting them.

An output switchover circuit 904 switches the read output of the read sense amplifier circuit 11a and the data poling signal, and transfers the switched signal to an output buffer 906.

A data comparator circuit 905 determines output data verify-read by the verify sense amplifier circuit 11b in data write mode or data erase mode. If in the data write mode, the data comparator circuit 905 compares write data supplied from an input buffer 907 with verify read data. If the result is not sufficient (NG), a signal denoting the result is sent to the write/erase control circuit 15 so that a rewrite operation is carried out repeatedly. Likewise, in the erase mode, if the verify result is not sufficient (NG), the signal denoting the result is sent to the write/erase control circuit 15 so that the re-erase operation is carried out repeatedly.

The following is a description on the case of simultaneously carrying out data erase/write operation and data read operation in the flash memory having the above configuration by referring to FIGS. 1 to 15. More specifically, in the present embodiment, the following is a description on the operation of reading data in a core, after the erase/write operation with respect to the specified blocks in the core is completed, while erasing or writing data in a specified another core or cores is not completed, as shown in FIG. 8.

In FIG. 1, when write command is inputted to the chip, the interface circuit 14 outputs a write flag WRITE as an internal signal. When receiving this internal signal, the address buffer 10 makes the following operation. That is, the write signal of the memory cell carrying out the data write is latched in the address buffer 10 until the write is completed, while address data latched on the write/erase address bus line 6b is outputted. Block information denoting a specified block or blocks each including write-object cells is written into the corresponding register R of the core block register 42 included in the switch control circuit 18 in the corresponding core C as busy information "H".

In the core such as the core C(0) thus selected, the core busy output circuit 431(0) outputs core busy output "H" (enable signal ENBb="H"). By doing so, the core selection signal SELb of the core C(0) becomes "H"; therefore, a read request to the core C(0) is inhibited.

According to the enable signal ENBb and the core selection signal SELb, the write address signal on the write/erase address bus line 6b is inputted to the decoder 2(0) of the selected core C(0). Simultaneously, the power-supply potential of the write/erase power line 8b is supplied to the row/column decoders 2(0) to 2(m-1) so that the write/erase data bus line 7b can be connected to the data line 4(0) of the core C(0). By doing so, data write is carried out in the selected memory cell of the selected core C(0).

In the write mode, a write load circuit is controlled according to write data inputted from the I/O pad and latched on the data comparator circuit 905 via the data input buffer 907. During the write mode, for example, if a data read request is made with respect to memory cells of a core C(1) other than the core C(0), in the core C(1), data read is carried out because the core busy output, that is, the enable signal ENBb is "L" and the core selection signal SELb is "L".

In other words, the address signal of the read address bus line 6a is supplied to the row/column decoder 2(1) of the core C(1) while the read power-supply potential being supplied thereto. The data of the selected memory cell is read to the data line 4(1), and transferred to the read sense amplifier circuit 11a via the read data bus line 7a, thereafter, detected and amplified therein.

When the address of the core C(0) carrying out write is inputted as read address, in the core C(0), the data poling signal POL becomes "H" because the enable signal ENBb is "H". The data poling signal is outputted to the external device by the output switchover circuit 904.

The data read operation is executable with respect to memory cell data other than the core C(0) carrying out write; therefore, no limitation exists in bank area.

The following is a description on the operation of reading data during the execution of data erase operation in the flash memory having the above configuration.

When data erase command is inputted, the interface circuit 14 outputs an erase flag ERASE. By doing so, busy information "H" is written into the erase-object block register. Simultaneously, the counter circuit 506 is operated in the address buffer 10 so as to sequentially search all block registers. If the address coincides with the address of the core C(0) including the block into which the busy information "H" is written, the core selection signal SELb becomes "H". Similar to the above write case, the erase power of the write/erase power line 8b is supplied to the decoder 2(0), and the address of the write/erase address bus line 6b is supplied so that the local data line 4(0) can be connected to the write/erase data bus line 7b. In this manner, the erase voltage is applied to the object block. Thereafter, the memory cell of the object block is incremented by the counter circuit 506, and successively verified.

The read operation during erasing is the same as the above case of carrying out the write operation.

The flash memory of the first embodiment has an automatic multi-block erase function. The automatic multi-block erase function makes the procedures according to the flow shown in FIG. 12 to FIG. 15 when serially erasing data from several erase-object selection blocks selected across several bank at the unit of block.

Figure 12:
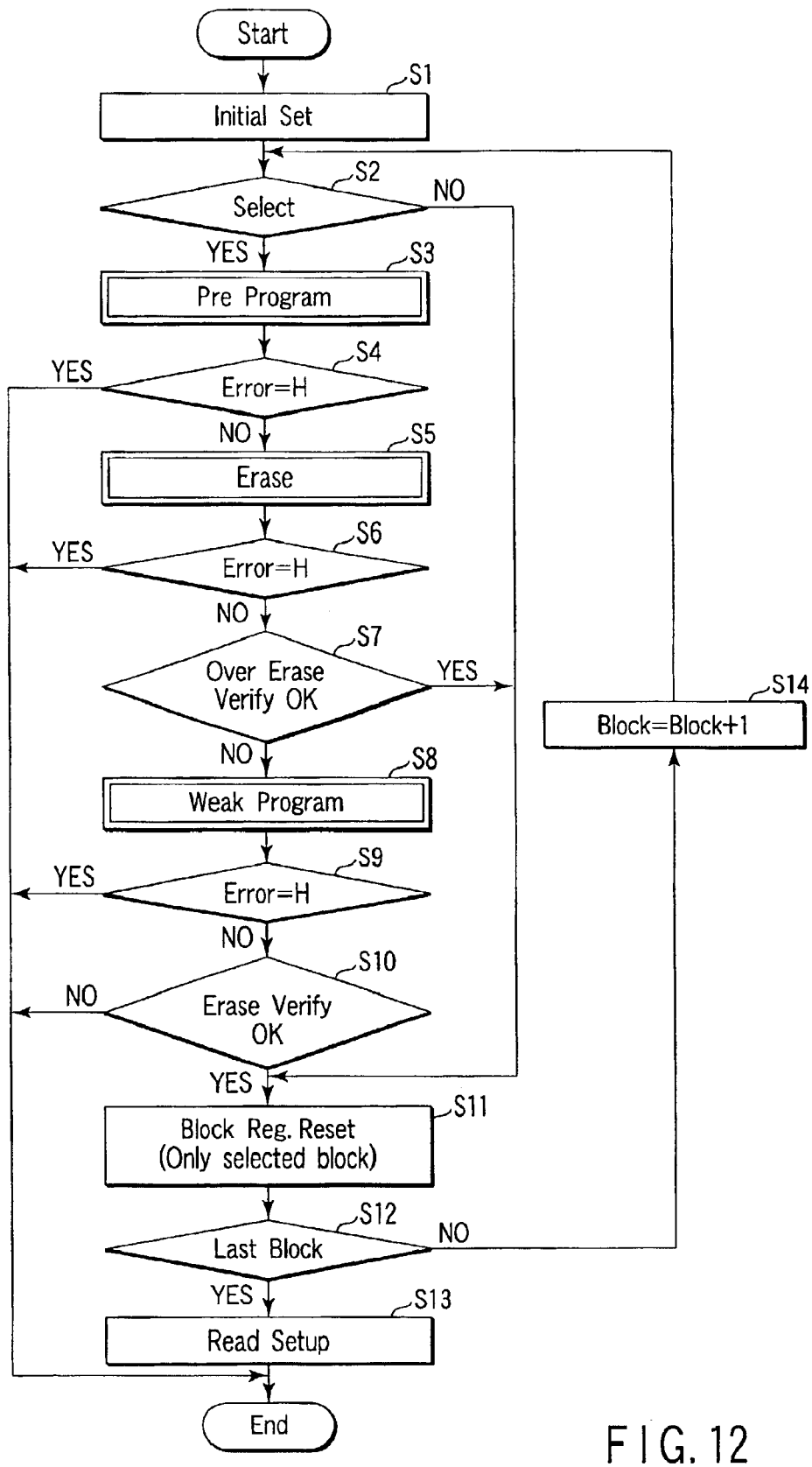
FIG. 12 is a main flowchart schematically showing the flow of operations when serially erasing data from a plurality of memory blocks at the unit of block in the flash memory of the embodiment shown in FIG. 1.

FIG. 12 is a main flowchart schematically showing the flow of procedures when serially erasing data from a plurality of memory blocks at the unit of block in the flash memory of the embodiment shown in FIGS. 1 to 11.

Figure 13:
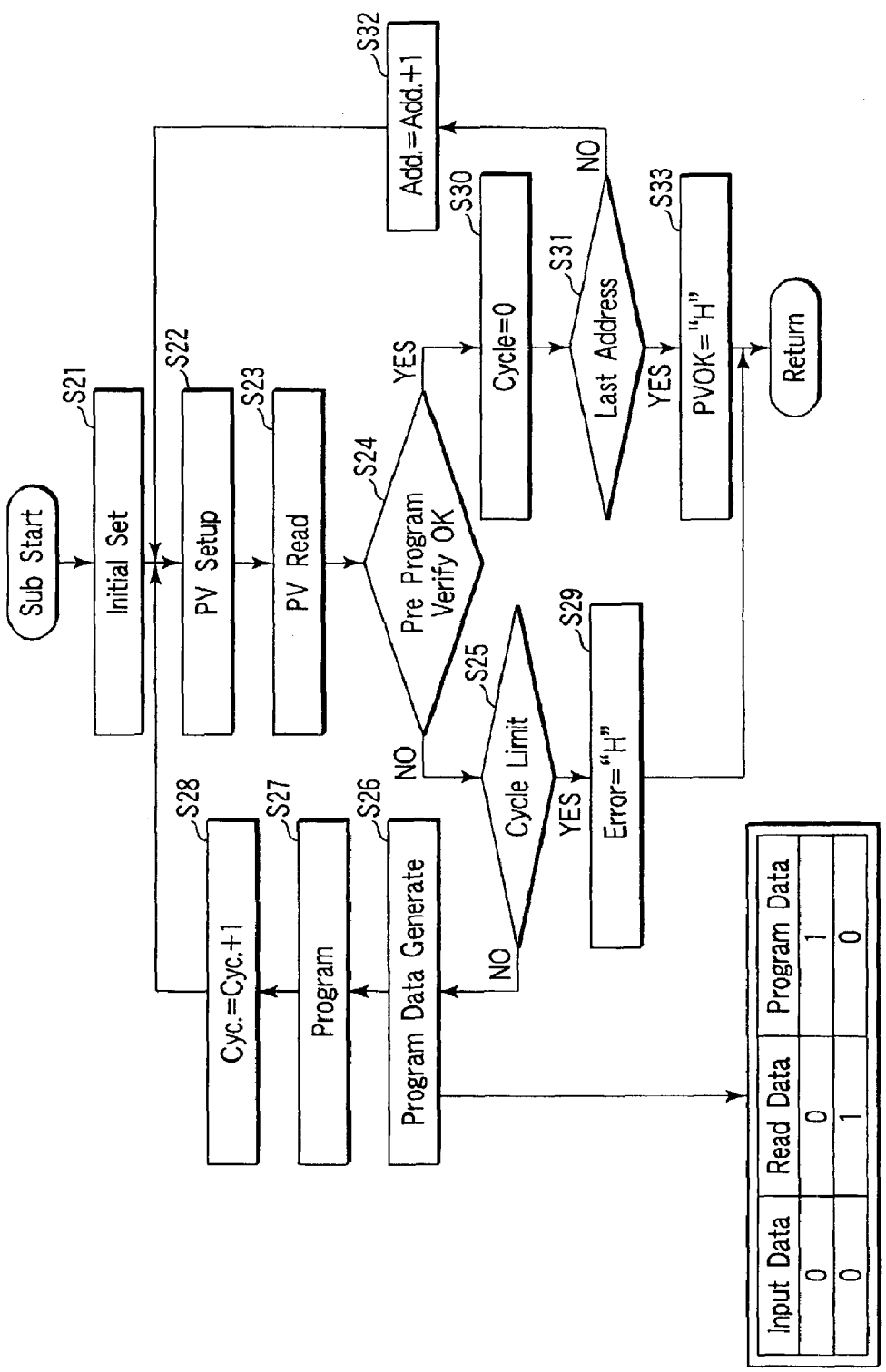
FIG. 13 is a sub-flowchart schematically showing the flow of sub-operations in FIG. 12.

FIG. 13 is a sub-flowchart schematically showing the flow of sub-procedures (Pre-program) in FIG. 12.

Figure 14:
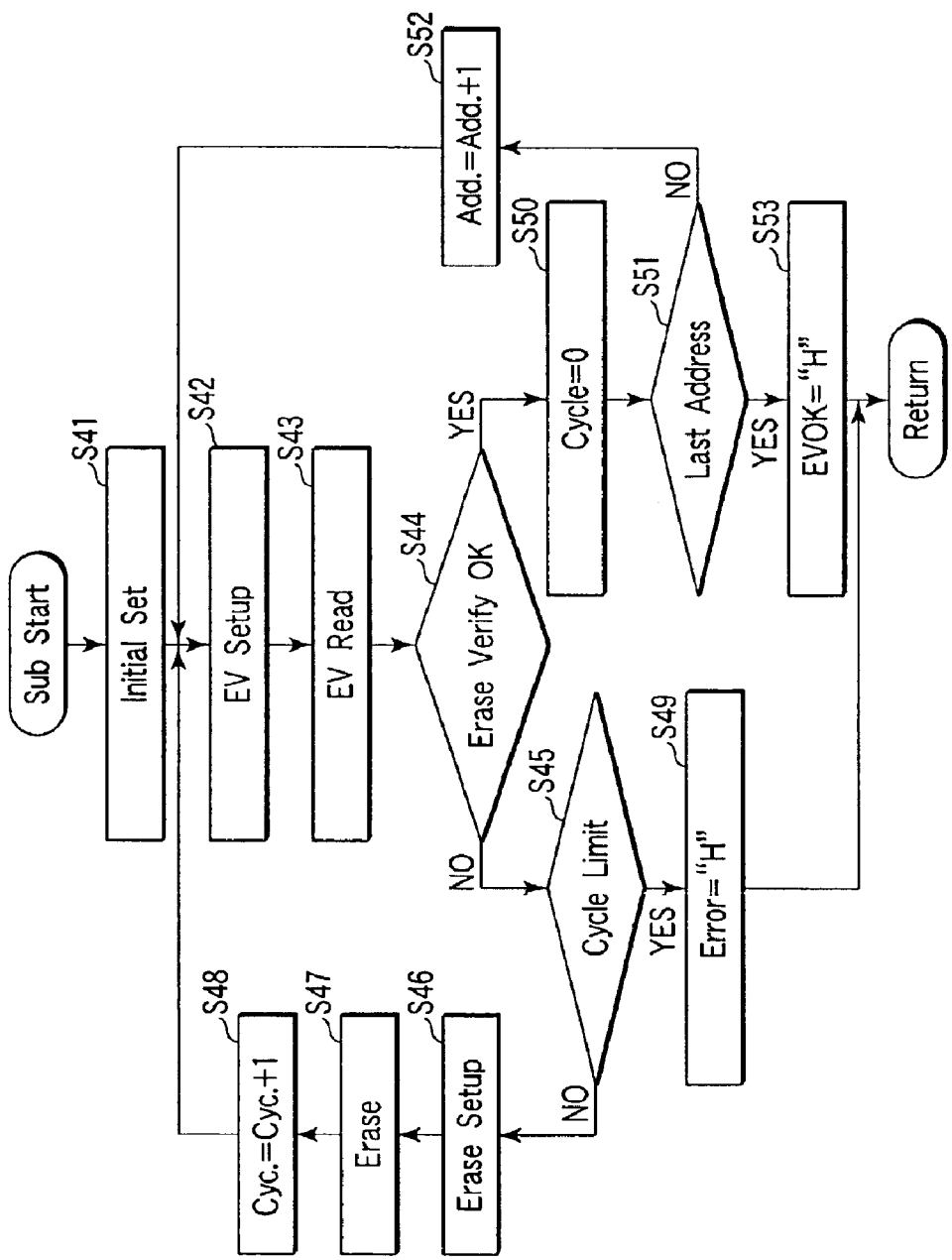
FIG. 14 is a sub-flowchart schematically showing the flow of another sub-operations in FIG. 12.

FIG. 14 is a sub-flowchart schematically showing the flow of another sub-procedures (Erase) in FIG. 12.

Figure 15:
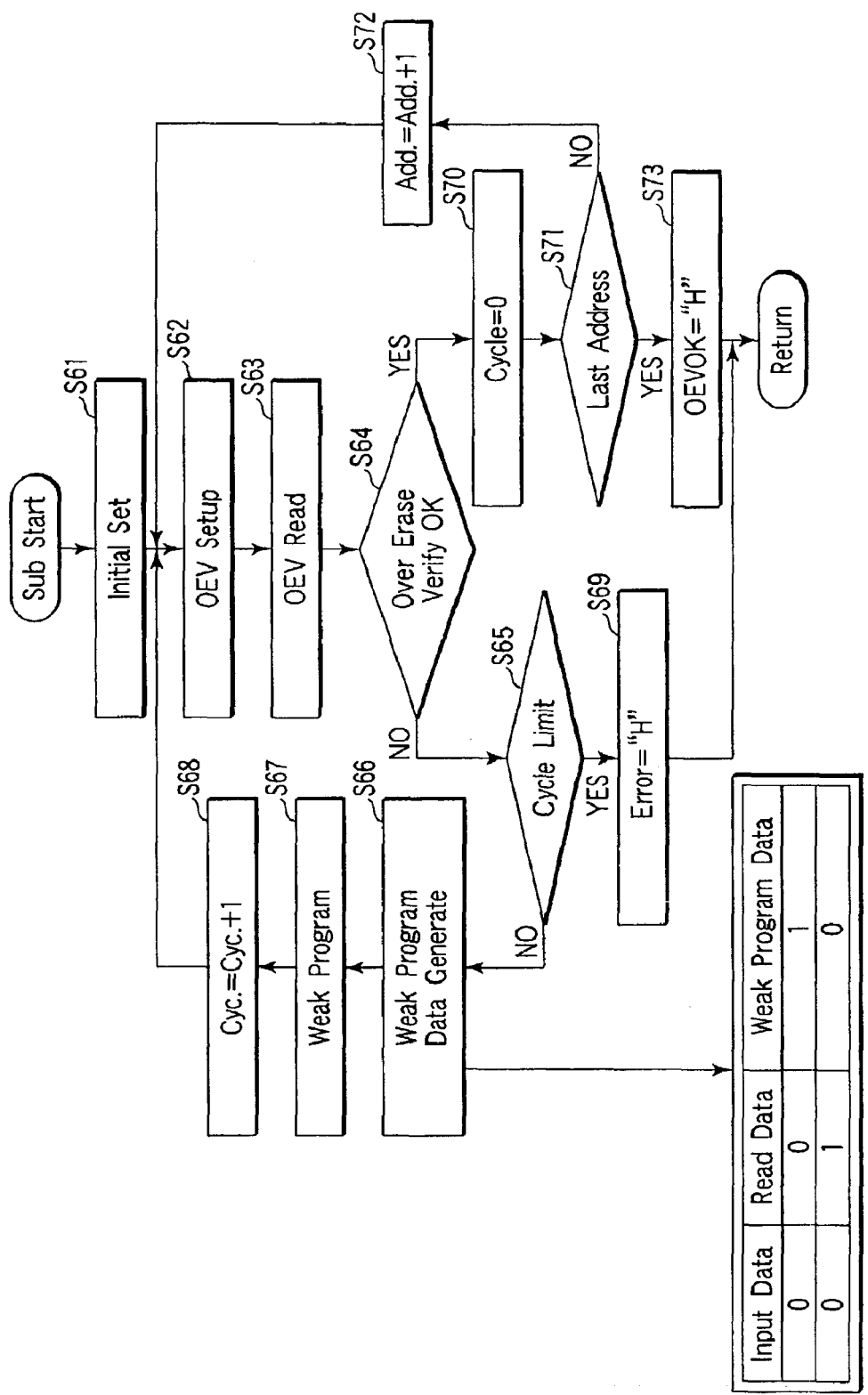
FIG. 15 is a sub-flowchart schematically showing the flow of still another sub-operations in FIG. 12.

FIG. 15 is a sub-flowchart schematically showing the flow of still another sub-procedures (Weak Program) in FIG. 12.

As shown in FIG. 12, when the main procedure starts, initial set is made in step S1, thereafter, it is determined whether or not the block is erase selection block (Select) in step S2. If the block is the selected block (the result is YES), the sub-procedures (Pre-program) shown in FIG. 13 are carried out in step S3. The result of the step S3 is checked in step S4 whether or not (Error="H") is obtained.

Further, the sub-procedures (Erase) shown in FIG. 14 are carried out in step S5 so that the result (Error="H") can be checked in step S6. After over erase verify is determined (Over Erase Verify OK) in step S7, the sub-procedures (Weak Program) shown in FIG. 15 are carried out in step S8 so that the result (Error="H") can be checked in step S9.

After erase verify is determined (Erase Verify OK) in step S10, the selection block register of the selected block is reset (Block Reg. Reset) in step S11. If NO is obtained in step S12, the operation goes to step S14 to process next block (Block+1), and the operation returns to the step S2.

Referring to FIG. 13, sub-flowchart schematically showing the flow of sub-procedures (Pre-program) of the step S3 in FIG. 12 will be described here.

First, a predetermined initial state for the pre-program is set at the step S21. Then, the program verifying process is set up at step S22 for verifying a threshold level in a pre-programmed memory cell. The process goes to the next step S23 where the set pre-program level is read.

The read result at the step S23 is checked at step S24. If the result denotes that the pre-program verify is NO, the process goes to step S25 to check whether the number of pre-program or cycle reaches at a limit. If NO in the step S25, program data is generated at step S26 according to the table associated to the step S26. As shown in the associated table, input data is determined as "0" and the program data to be generated is determined in accordance with the contents of the read data read at the step S23. When the read data is "0", data "1" is generated and when the read data is "1", data "0" is generated.

According to the generated data, programming is done at step S27 and the number of cycle is incremented by "1" at step S28 and the process returns to the step S22.

When the number of the cycle reaches at the limit, the result obtained at the step S25 becomes at YES, and the process goes to step S29 where Error="H" is set to terminate the Pre-Program routine of the step S3. After "YES" is obtained at the step S25, the result being obtained at the step S24 becomes to "YES", and the number of the cycle is reset at "0" at step S30. Then, a check is done at step S31 to check whether the address of the block is last or not.

If NO is obtained at the step S31, the designated address is incremented by 1 at step S32 and the process returns to the step S22 to repeat the operations of the steps S22 to S31. If YES is obtained at the step S31, a flag denoting that the result of the program verify is OK is set to "H" at step S33 to terminate the Pre-Program routine at the step S3 so as to return the operation to the main routine shown in FIG. 12.

Now, the sub-procedures (Erase) of the step S5 shown in FIG. 12 will be described by referring to the flowchart shown in FIG. 14.

First, a predetermined initial state for the erase process is set at step S41. Then, the erase verifying process is set up at step S42 for verifying a threshold level in a memory cell being erased. The process goes to the next step S43 where the erased threshold level is read.

The read result at the step S43 is checked at step S44. If the result denotes that the erase verify is NO, the process goes to step S45 to check whether the number of erasing process or cycle reaches at a limit. If NO in the step S45, erase state is set up at step S46. Then, the erasing is done at step S47 and the number of cycle is incremented by "1" at step S48 and the process returns to the step S42.

When the number of the cycle reaches at the limit, the result obtained at the step S45 becomes at YES, and the process goes to step S49 where Error="H" is set to terminate the erasing routine of the step S5. After "YES" is obtained at the step S45, the result being obtained at the step S44 becomes to "YES", and the number of the cycle is reset at "0" at step S50. Then, a process is done at step S51 to check whether the address of the block being erased is last or not.

If NO is obtained at the step S51, the designated address is incremented by 1 at step S52 and the process returns to the step S42 to repeat the operations of the steps S42 to S51. If YES is obtained at the step S51, a flag denoting that the result of the erase verify is OK is set to "H" at step S53 to terminate the Erase routine at the step S5 so as to return the operation to the main routine shown in FIG. 12.

Now, a sub-flowchart schematically showing the flow of still another sub-procedures (Weak Program) in FIG. 12 will be described by referring to FIG. 15.

First, a predetermined initial state for the weak-program is set at the step S61. Then, the over erase verifying process is set up at step S62 for verifying a threshold level in a over-erased memory cell. The process goes to the next step S63 where the over-erased level is read.

The read result at the step S63 is checked at step S64. If the result denotes that the over erase verify is NO, the process goes to step S65 to check whether the number of weak-program or cycle reaches at a limit. If NO in the step S65, weak program data is generated at step S66 according to the table associated to the step S66. As shown in the associated table, input data is determined as "0" and the program data to be generated is determined in accordance with the contents of the read data read at the step S63. When the read data is "0", data "1" is generated and when the read data is "1", data "0" is generated.

According to the generated data, weak-programming is done at step S67 and the number of cycle is incremented by "1" at step S68 and the process returns to the step S62.

When the number of the cycle reaches at the preset limit, the result obtained at the step S65 becomes at YES, and the process goes to step S69 where Error="H" is set to terminate the Weak Program routine of the step S8. After "YES" is obtained at the step S65, the result being obtained at the step S64 becomes to "YES", and the number of the cycle is reset at "0" at step S70. Then, a check is done at step S71 to check whether the address of the block is last or not.

If NO is obtained at the step S71, the designated address is incremented by 1 at step S72 and the process returns to the step S62 to repeat the operations of the steps S62 to S71. If YES is obtained at the step S71, a flag denoting that the result of the program verify is OK is set to "H" at step S73 to terminate the Weak-Program routine at the step S8 so as to return the operation to the main routine shown in FIG. 12.

The above operation is successively carried out with respect to the final selected block checked in step S12 in FIG. 12. When the output of the OR gate 431(0) shown in FIG. 8 becomes LOW, the switches 3(0) and 16(0) become at an open state and the data read operation from the core C(0) is enabled even if the erase operation for the next core C(1) is not completed. And thereafter, a read operation enable state (Read Setup) is obtained in step S13, and the main procedure ends.

Namely, since the flash memory has the configuration as shown in FIGS. 1 and 8, when the data erase operation of all selected blocks in the specified bank or core C(0) is completed, for example, the data read operation of this bank or core C(0) is possible, even if the data erase operation in the other specified bank or core (core C(1), for example) is not completed. Thus, it is possible to simultaneously carry out the data read operation of the bank or core and the data erase operation of another bank or core on the memory chip.

When serially selecting the erase-object selection block selected across several banks and erasing data at the unit of block, the following control is possible. That is, before designating address for selecting the next block after the data erase of the selected block is normally completed, control is carried out so that the input of the reset signal to the selected register corresponding to the selected block can be permitted. In this case, the generation timing of the register reset signal may be set when the final address of the selected block is designated.

Therefore, data read from a bank including the erase-object blocks may be performed when the data erase for the bank is completed without waiting for time until the erase operation of the remaining all banks including erase-object blocks is completed.

As a result, data erase and data read can be carried out in parallel at a unit of bank when carrying out a test process for reconfirming whether or not cell data of each erase-object block of a certain bank is normally erased after the erase operation of all the erase-object blocks of this certain bank is completed. Therefore, it is possible to reduce time loss in the test process, and thus, to shorten the test time.

The above embodiment may be combined with not only the test sequence for erasing blocks but also the following test sequences. One is a test sequence for writing data to all cells of the selected block. Another is a test sequence for automatically writing/erasing specified pattern data to/from all cells of the selected block. Still another is a test sequence for limiting the number of write to a predetermined time and forcedly advancing addresses even if the verified result is not sufficient. By doing so, it is possible to further shorten the test time.

As is evident from the above description, the semiconductor memory device of the present invention has the following effect. When serially selecting the erase-object blocks across several banks and erasing data at the unit of block, data read of a bank including the erase-object blocks at which the erase operation is completed is possible without waiting for time until the erase operation of the remaining all erase-object blocks of another bank or banks is completed. Therefore, it is possible to reduce time loss in the test process, and thus, to shorten the test time, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array containing a plurality of banks each having one or more blocks;
   a data erase circuit configured to erase data from selected blocks in banks at a unit of block;
   a data read circuit configured to read data from memory cells provided in one bank of the banks; and
   an automatic multi-block erase circuit configured to enable the data read circuit, when data erase operation for all erase-object blocks in the one bank is completed, to execute a read operation with respect to the one bank, while continuing a data erasing operation of a next erase-object block included in another bank.

2. A semiconductor memory device comprising:
   a memory cell array having electrically rewritable non-volatile memory cells a predetermined number of which are defined as one block as a unit of data erase, the memory cell array including a plurality of banks each having one or more blocks;
   a bank selection circuit configured to select a given number of banks for writing or erasing data from said plurality of banks;
   a data write circuit configured to write data into selected memory cells in a bank selected by the bank selection circuit;

a data erase circuit configured to erase data from a selected block in a bank selected by the bank selection circuit at a unit of block;

a data read circuit configured to read data from memory cells provided in other bank, which is not selected by the bank selection circuit during a write/erase operation with respect to the bank selected by the bank selection circuit; and an automatic multi-block erase circuit configured to reset an erase flag set in a block selection register corresponding to an erase-object block included in one bank from which data erasing has been completed, so as to make the data read circuit enable to execute a read operation with respect to the one bank, before starting a data erasing operation of a next erase-object block included in another bank, during an execution of serially erasing data from a plurality of erase-object blocks included in a plurality of banks at a unit of block.

3. A semiconductor memory device according to claim 2, wherein the automatic multi-block erase circuit is configured to execute a read operation from a next bank, when serially erasing data from the erase-object selected blocks selected across said plurality of banks at the unit of block, without waiting for time until the erase operation of the remaining all erase-object blocks of the banks is completed.

4. A semiconductor memory device according to claim 3, wherein the automatic multi-block erase circuit comprises:

block decoders each provided correspondingly to each block of the banks, and configured to decode a block selection signal so as to output a block selection signal;

block selection registers each provided correspondingly to each block of the banks, set circuits each provided correspondingly to each block selection register, to set an erase flag to the corresponding block selection register when erasing and selecting the corresponding block;

reset circuits each provided correspondingly to each block selection register, to reset the erase flag set in the block selection register corresponding to the erase-object block from which the data erase operation is completed before data erase is shifted to a next erase-object block;

a logic circuit taking a logical sum of output signals of block selection registers of all the erase-object blocks in the bank; and a switch control circuit configured to control an access of the corresponding bank when receiving an output signal of the logic circuit.

5. A semiconductor memory device according to claim 4, wherein the set circuit comprises a first logical AND circuit, which takes a logical product of the block selection signal outputted from the corresponding block decoder and a set signal supplied when the erase-object block is selected, and sets the corresponding block selection register by the logical product, and the reset circuit comprises a second logical AND circuit, which takes a logical product of the block selection signal outputted from the corresponding block decoder and a reset signal supplied from the erase-object block at which data erase operation is completed before shifting to the erase operation of the next erase-object block.

6. A semiconductor memory device according to claim 5, wherein the reset signal is supplied when a final address of the erase-object block at which the data erase operation is completed is selected.

7. A semiconductor memory device according to claim 4, wherein the automatic multi-block erase circuit comprises address switch circuits and data switch circuits each of which is connected between the banks and commonly provided read address bus lines and write/erase address bus lines, and wherein the switch control circuits are configured to connect the read address bus lines and read data bus lines to the banks at a data read mode and to connect the write/erase address bus lines and write/erase data bus lines to the banks at a data write/erase mode.

8. A semiconductor memory device according to claim 7, wherein the automatic multi-block erase circuit is further configured to connect a read power source line to the banks at the data read mode and to connect a write/erase power source line to the banks at the data write/erase mode.

9. A semiconductor memory device comprising:

a memory cell array including a plurality of banks each having one or more blocks, each block having electrically erasable and programmable non-volatile memory cells and being defined as a unit of erasing data;

a core selection circuit configured to select a given number of banks during a data writing/erasing mode from said plurality of banks;

a block selecting circuit configured to select a given number of blocks in each of the banks selected by the core selection circuit;

a data writing circuit configured to write data to selected memory cells in each of blocks selected by the block selecting circuit;

a data erasing circuit configured to erase data from each of a blocks selected by the block selecting circuit at the unit of block;

a data reading circuit configured to read data from designated memory cells provided in a bank other than the bank selected by the core selection circuit during a write/erase operation with respect to the bank selected by the core selection circuit; and a resetting circuit configured to reset an erase flag set in a block selection register corresponding to an erase-object block in one bank from which data erasing has been completed, so as to make the data read circuit enable to execute a read operation with respect to the one bank, before starting a data erasing operation of a next erase-object block included in another bank, during an execution of serially erasing data from a plurality of erase-object blocks at a unit of block.

10. A semiconductor memory device comprising:

a memory cell array including a plurality of banks each having one or more blocks, each block having electrically erasable and programmable non-volatile memory cells and being defined as a unit of erasing data;

means for selecting a given number of banks during a data writing/erasing mode from said plurality of banks;

means for selecting a given number of blocks in each of the banks selected by the bank selecting means;

means for writing data to selected memory cells in each of blocks selected by the block selecting means;

means for erasing data from each of a blocks selected by the block selecting means at the unit of block;

means for reading data from designated memory cells provided in a bank other than the bank selected by the bank selecting means during a write/erase operation with respect to the bank selected by the bank selecting means; and means for resetting an erase flag set in a block selection register corresponding to an erase-object block in one bank from which data erasing has been completed, so as to make the data read circuit enable to execute a read operation with respect to the one bank, before starting a data erasing operation of a next erase-object block included in another bank, during an execution of serially erasing data from a plurality of erase-object blocks at a unit of block.

11. A method of controlling a semiconductor memory device containing a memory cell array including a plurality of banks each having one or more blocks, each block having electrically erasable and programmable non-volatile memory cells and being defined as a unit of erasing data, comprising:

selecting a given number of banks during a data writing/erasing mode from said plurality of banks;

selecting a given number of blocks in each of the banks selected by a core selection circuit;

writing data to selected memory cells in each of blocks selected by a block selecting circuit;

erasing data from each of a blocks selected by the block selecting circuit at the unit of block;

reading data from designated memory cells provided in a bank other than the bank selected by the core selection circuit during a write/erase operation with respect to the bank selected by the core selection circuit;

resetting an erase flag set in a block selection register corresponding to an erase-object block in one bank from which data erasing has been completed, so as to make enable to execute a read operation with respect to the one bank, before starting a data erasing operation of a next erase-object block included in another bank, during an execution of serially erasing data from a plurality of erase-object blocks at a unit of block; and reading data from the one bank while executing the serially erasing data from the erase-object blocks in the another bank.

* * * * *